United States Patent
Tasaka

(10) Patent No.: US 7,342,598 B2
(45) Date of Patent: Mar. 11, 2008

(54) APPARATUS AND METHOD FOR RECORDING IMAGE ON PRINTING PLATE

(75) Inventor: Kazutaka Tasaka, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 398 days.

(21) Appl. No.: 10/791,906

(22) Filed: Mar. 4, 2004

(65) Prior Publication Data
US 2004/0196357 A1  Oct. 7, 2004

(30) Foreign Application Priority Data
Apr. 3, 2003  (JP)  .......................... P2003-099880

(51) Int. Cl.
*B41J 2/435*  (2006.01)
*B41J 2/47*  (2006.01)
(52) U.S. Cl. ...................... 347/235; 347/250
(58) Field of Classification Search ............... 347/41, 347/225, 234–235, 248–250, 116; 358/1.18, 358/1.9, 406, 451, 474, 300; 101/483, 485
See application file for complete search history.

(56) References Cited

U.S. PATENT DOCUMENTS

| | | | | |
|---|---|---|---|---|
| 4,174,527 A | * | 11/1979 | Schaefer | 358/406 |
| 4,686,580 A | * | 8/1987 | Kato et al. | 358/451 |
| 4,687,944 A | * | 8/1987 | Mitsuka et al. | 358/474 |
| 5,001,575 A | * | 3/1991 | Nakahara | 358/451 |
| 5,528,378 A | * | 6/1996 | Wada | 358/300 |
| 6,018,618 A | * | 1/2000 | Yoshida | 358/1.18 |
| 6,290,327 B1 | * | 9/2001 | Hosokawa et al. | 347/41 |
| 6,700,679 B1 | * | 3/2004 | Fujita et al. | 358/1.9 |
| 6,729,239 B2 | * | 5/2004 | Edamitsu et al. | 101/485 |
| 2003/0136286 A1 | * | 7/2003 | Hideshima | 101/483 |

FOREIGN PATENT DOCUMENTS

| | | |
|---|---|---|
| JP | 2000-280439 A | 10/2000 |
| JP | 2001-88267 A | 4/2001 |
| JP | 2002-67268 A | 3/2002 |

* cited by examiner

*Primary Examiner*—Hai Pham
(74) *Attorney, Agent, or Firm*—McDermott Will & Emery LLP

(57) ABSTRACT

A printing apparatus with a plate-making mechanism with a data modification part for modifying width of an original image in a subscan direction by computation to obtain a modified image and a controller for recording an image with its length in a main scan direction modified by shifting a writing clock in image recording. This allows reduction in the amounts of computation as compared with a case where modification against extension of a paper in the main scan direction and subscan direction is performed only by computation and makes it easy to control modification as compared with a case where the modification in the main scan direction and subscan direction is performed only by shifting the writing clock and a moving clock for a writing head. Thus, it becomes possible to easily correct the influence of extension of paper in printing.

34 Claims, 20 Drawing Sheets

APPARATUS AND METHOD FOR RECORDING IMAGE ON PRINTING PLATE

BACKGROUND OF THE INVENTION

1. Field of the Invention

The present invention relates to a technique for recording an image onto a printing plate and a technique for modifying width of an image.

2. Description of the Background Art

Conventionally, a technique called CTP (Computer To Plate) for making a printing plate by directly outputting data of an image from a computer to a printing plate has been used. This CTP technique remarkably reduces process for plate making. A printing apparatus equipped with a plate-making apparatus has been developed as disclosed in Japanese Patent Application Laid Open Gazette Nos. 2000-280439 and 2002-67268. Such an apparatus allows quick transition from a plate-making process to a printing process, thereby achieving various types of printings with high efficiency.

Further, to achieve high-speed plate making in the CTP technique used are a multibeam irradiation where a plurality of light beams are emitted to a printing plate and a "spiral exposure (spiral image recording)" where a plurality of light beams are emitted while a writing head is continuously moved along a direction of rotation axis of a drum wound with a-printing plate, as disclosed in Japanese Patent Application Laid Open Gazette No. 2000-280439.

In a highly-developed printing apparatus for commercial use, there arises a micro-level misregistration of printing position, of about several hundred micrometers, which is caused by errors in machining and setting of parts, extension and contraction (caused by humidity) in printing which varies among papers (pieces of paper), or the like. Particularly, a paper extends mainly in a printing direction due to dampening water and also extends in a direction orthogonal to the printing direction at the end of paper in the printing direction. Such a phenomenon as extension of paper is called "fan-out". The misregistration of printing position, which may become a cause of failure in precise registration of images obtained by printing with various colors in multicolor printing, is not negligible.

In order to prevent the misregistration due to fan-out, conventionally has been used a method where a printing plate is distorted by a skilled workman through technical application of force in setting the printing plate around a plate cylinder. But this method depends on the ability of the workman, so is not preferable one.

On the other hand, as disclosed in Japanese Patent Application Laid Open Gazette No. 2002-67268, it is suggested to change movement of irradiation positions of light beams in plate making by hardware. In this case, change in a main scan direction (direction of rotating a drum which holds the printing plate) is made by shifting a writing clock (for example, by changing a frequency multiplication factor used for obtaining the writing clock) and change in a subscan direction is made by changing a reducing projection ratio of light beam while moving a writing head towards a direction opposite to the subscan direction in a non-writing region near a plate gripper, i.e., performing "switchback".

The method where the irradiation positions of light beams and irradiation timing are changed by hardware is good in that change of less than 1 dot (e.g., 1/10 dot) is possible and it is not necessary to modify image data, but the mass of a writing head is very great and for switchback, a large force is needed. As a result, it is not possible to efficiently utilize the characteristic feature of spiral exposure that allows stable movement of the light irradiation positions and it becomes difficult to perform a quick control of irradiation positions by micrometers.

Since the fan-out of paper is not linear in the printing direction, a complicate control is required to perform modification of image only by writing control in the main scan direction and subscan direction.

SUMMARY OF THE INVENTION

The present invention is intended for an image recording apparatus for recording an image by irradiating a printing plate with a light beam, and it is a main object to quickly perform highly-developed modification in consideration of an influence of fan-out or the like in image recording.

According to the present invention, the image recording apparatus comprises a holding drum for holding a printing plate, a light emission part for irradiating the printing plate with a light beam to perform writing, a rotation mechanism for scanning an irradiation position of the light beam on the printing plate in a main scan direction by rotating the holding drum relatively to the light emission part, a moving mechanism for scanning the irradiation position in a subscan direction by moving the light emission part relatively to the holding drum along a direction parallel to a rotation axis of the holding drum, a storage part for storing data of an original image, an operation part for generating data of a modified image obtained by substantially modifying width of the original image in the subscan direction, and a control part for controlling emission of the light beam according to the data of the modified image while shifting writing timing in the main scan direction.

In the apparatus of the present invention, it is possible to easily correct distortion of an image caused in printing by extension of a paper in image recording.

According to a preferred embodiment of the present invention, the operation part modifies the width of the original image in the subscan direction by deleting or adding pixels, and preferably the operation part divides a pixel group constituted of pixels aligned in the subscan direction into a plurality of modification unit pixel groups as many as pixels to be deleted or added and determines a position of one pixel to be deleted or added from/to each of the plurality of modification unit pixel groups on the basis of a random number. It is thereby possible to prevent deterioration in image quality.

According to a more specific preferred embodiment of the present invention, the storage part stores positions of pixels to be deleted or added in the original image and processing instruction data substantially indicating distortion of the original image in the modified image, and the operation part generates data of the modified image on the basis of the processing instruction data. The processing instruction data comprises commands for inserting a blank to one end of the subscan direction in an image space where the modified image is generated, and commands for deleting or adding a pixel in aligning pixels of the original image from the one end to the other end with following the blank. It is thereby possible to quickly obtain the modified image.

The present invention is further intended for a printing apparatus comprising the above image recording apparatus and a printing mechanism for performing printing with a printing plate on which an image is recorded by the light emission part. According to a more preferable example, printing is performed by using the printing plate held by the holding drum. It is thereby possible to modify an image in printing even when image recording and printing are performed in one apparatus.

Preferably, the printing apparatus further comprises an image pickup part for performing an image pickup of a paper on which the test pattern is printed, to acquire the printing result, and the operation part obtains data of the modified image and data of shifting of writing timing in the main scan direction by the control part, on the basis of a printing result of the test pattern. It is therefore possible to automatically obtain the amount of modification.

The present invention is still further intended for an image recording method of recording an image onto a printing plate, which allows easy modification of distortion of the image caused by extension of a paper in printing. An image modification method in this image recording method can be applied to various aspects where the width of an image is modified.

These and other objects, features, aspects and advantages of the present invention will become more apparent from the following detailed description of the present invention when taken in conjunction with the accompanying drawings.

BRIEF DESCRIPTION OF THE DRAWINGS

FIG. 24 is a block diagram showing functions implemented by a CPU and the like;

DESCRIPTION OF THE PREFERRED EMBODIMENTS

Figure 1:
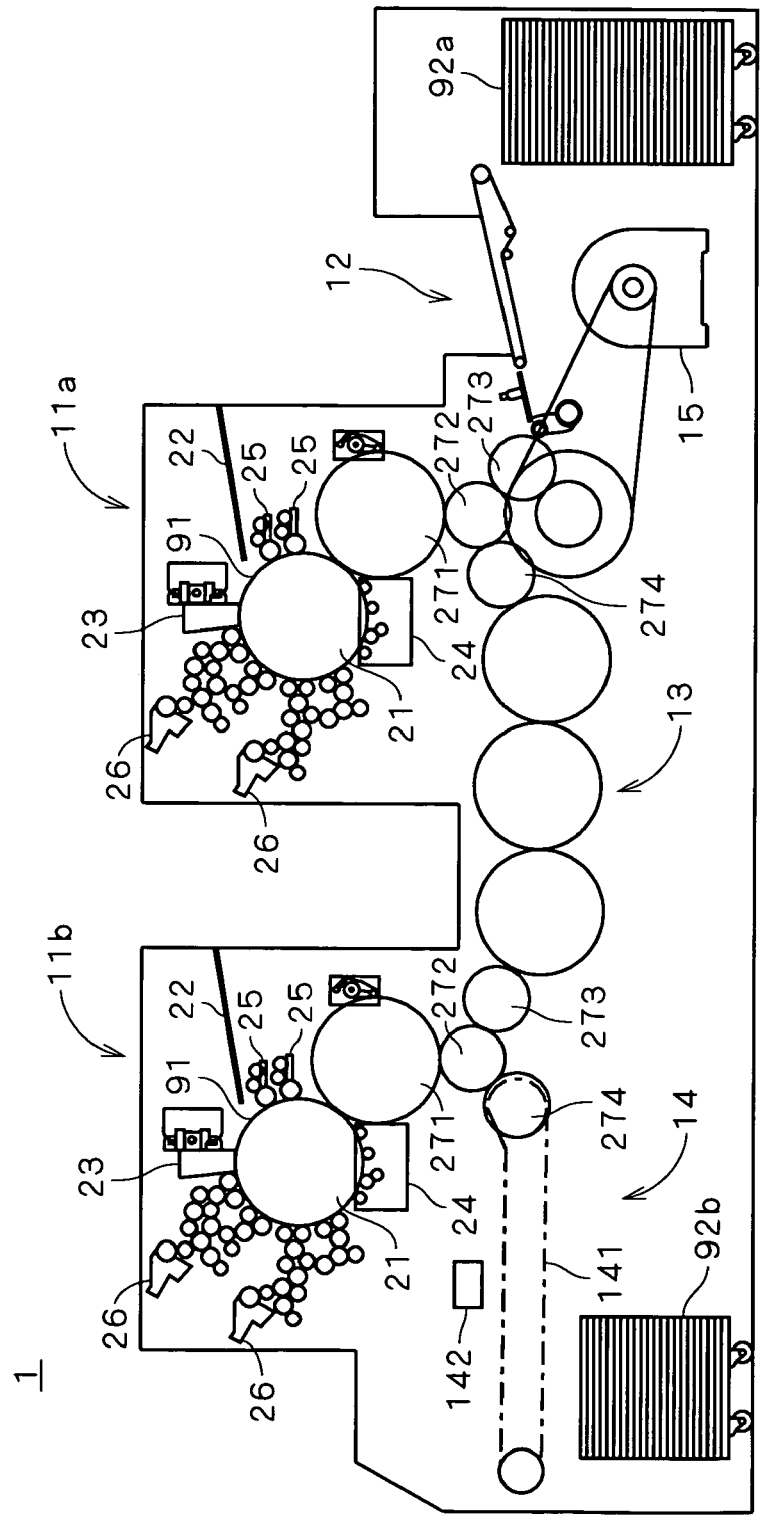
FIG. 1 is a side overview of a printing apparatus.

FIG. 1 is a side overview of a printing apparatus 1 in accordance with a preferred embodiment of the present invention. The printing apparatus 1 comprises a first printing unit 11a and a second printing unit 11b each capable of performing multicolor printing of two colors, a paper feed part 12 for feeding a paper (a piece of paper) 92a before printing to the first printing unit 11a, an intermediate transfer part 13 for transferring a paper from the first printing unit 11a to the second printing unit 11b, a paper output part 14 for outputting a paper 92b after printing from the second printing unit 11b and a driving part 15 for driving the above constituent elements in synchronization.

Each of the first printing unit 11a and the second printing unit 11b (hereafter, referred to as "printing unit 11") has a plate cylinder 21 for holding a printing plate 91 including two image regions on its side surface, and around the plate cylinder 21 provided are a plate feed/removal part 22 for feeding and removing the printing plate to/from the plate cylinder 21, a writing part 23 for irradiating the printing plate 91 on the plate cylinder 21 with light beams to record an image, a developing part 24 for developing the printing plate 91 after image recording, two dampening water feeders 25 for feeding dampening water to the printing plate 91 and two ink feeders 26 for feeding ink to the printing plate 91. There may be a case where one printing plate includes one image region and two printing plates are held on the plate cylinder 21.

In the printing unit 11 provided are a blanket cylinder 271 in contact with the plate cylinder 21 and an impression cylinder 272 in contact with the blanket cylinder 271, and the blanket cylinder 271 comes into contact selectively with the plate cylinder 21 or the impression cylinder 272. A feed cylinder 273 and a removal cylinder 274 are in contact with the impression cylinder 272.

Figure 2:
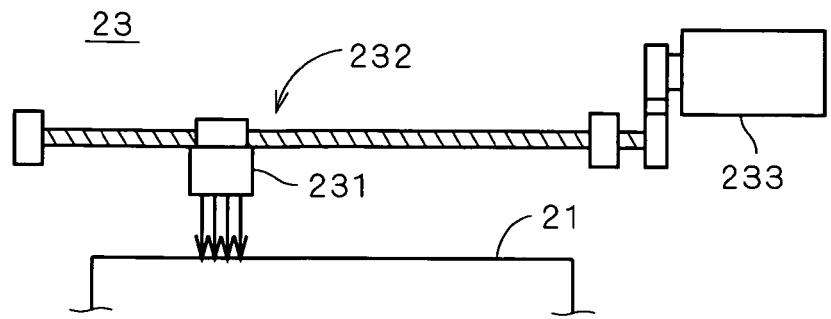
FIG. 2 is a front view showing a writing part.

FIG. 2 is a front view showing a writing part 23. The writing part 23 has a writing head 231 for emitting a plurality of modulated light beams, a ball-screw mechanism 232 for moving the writing head 231 along a side surface of the plate cylinder 21 in a direction parallel to a rotation axis of the plate cylinder 21, and a head moving motor 233 for rotating a ball screw of the ball-screw mechanism 232. The writing head 231 emits a plurality of light beams, being aligned in parallel to a direction of its movement (subscan direction), to perform a multibeam exposure.

The paper output part 14 shown in FIG. 1 has a belt 141 connected to the removal cylinder 274 in the second printing unit 11b, an image pickup part 142 for performing an image pickup of the paper 92b after printing with a line sensor while the paper 92b is transferred on the belt 141, an ejection tray in which papers 92b are accumulated, and the like.

In the printing apparatus 1, the printing unit 11 performs plate making before printing. In plate making, first, the printing plate 91 before exposure (writing) is fed from the plate feed/removal part 22 to the plate cylinder 21, a gripper in the plate cylinder 21 holds an end portion of the printing plate 91 and the printing plate 91 is wound around the side surface of the plate cylinder 21. At this time, the constituents around the plate cylinder 21, such as the blanket cylinder 271 and the ink feeder 26, are removed from the plate cylinder 21 and the plate cylinder 21 is rotated alone.

Next, while the plate cylinder 21 is rotated at a constant speed, emission of light beams from the writing head 231 is started in response to a signal from a computer connected to the main body of printing apparatus 1. Irradiation positions on the printing plate 91 are thereby moved in the main scan direction. The writing head 231 is continuously moved by the ball-screw mechanism 232 shown in FIG. 2 in a direction parallel to the rotation axis of the plate cylinder 21, and the irradiation positions on the printing plate 91 are continuously moved in the subscan direction as well as in the main scan direction, to continuously perform writing onto the whole printing plate 91 (spiral exposure). After the writing (i.e., image recording) on the printing plate 91, a roller of the developing part 24 comes into contact with the printing plate 91 to develop the printing plate 91, and thus the plate-making process is finished and accompanied by a printing process.

In printing, the dampening water feeders 25 feed dampening water to the printing plate 91 on the plate cylinder 21 while the ink feeders 26 feed ink thereto and the ink is transferred from the plate cylinder 21 to the blanket cylinder 271. Thus, in the printing apparatus 1, printing is performed with the printing plate 91 held on the holding drum (plate cylinder 21) used in the image recording. On the other hand, the paper is fed from the feed cylinder 273 to the impression cylinder 272, where the ink on the blanket cylinder 271 is transferred onto the paper, and led to the removal cylinder 274. The diameters of the plate cylinder 21 and the blanket cylinder 271 each twice as large as that of the impression cylinder 272, and while the impression cylinder 272 is rotated twice with the paper held on the impression cylinder 272, two-color printing is performed on the paper.

As the whole operation of the printing apparatus 1, the paper 92a before printing is led from the paper feed part 12 to the first printing unit 11a and two-color printing (K (black) and C (cyan)) is performed on the paper, and then the paper is led through the intermediate transfer part 13 to the second printing unit 11b and two-color printing (M (magenta) and Y (yellow)) is performed on the paper. The paper 92b after printing is led to the paper output part 14, and accumulated. As required, printing may be performed with three colors or less.

Figure 3:
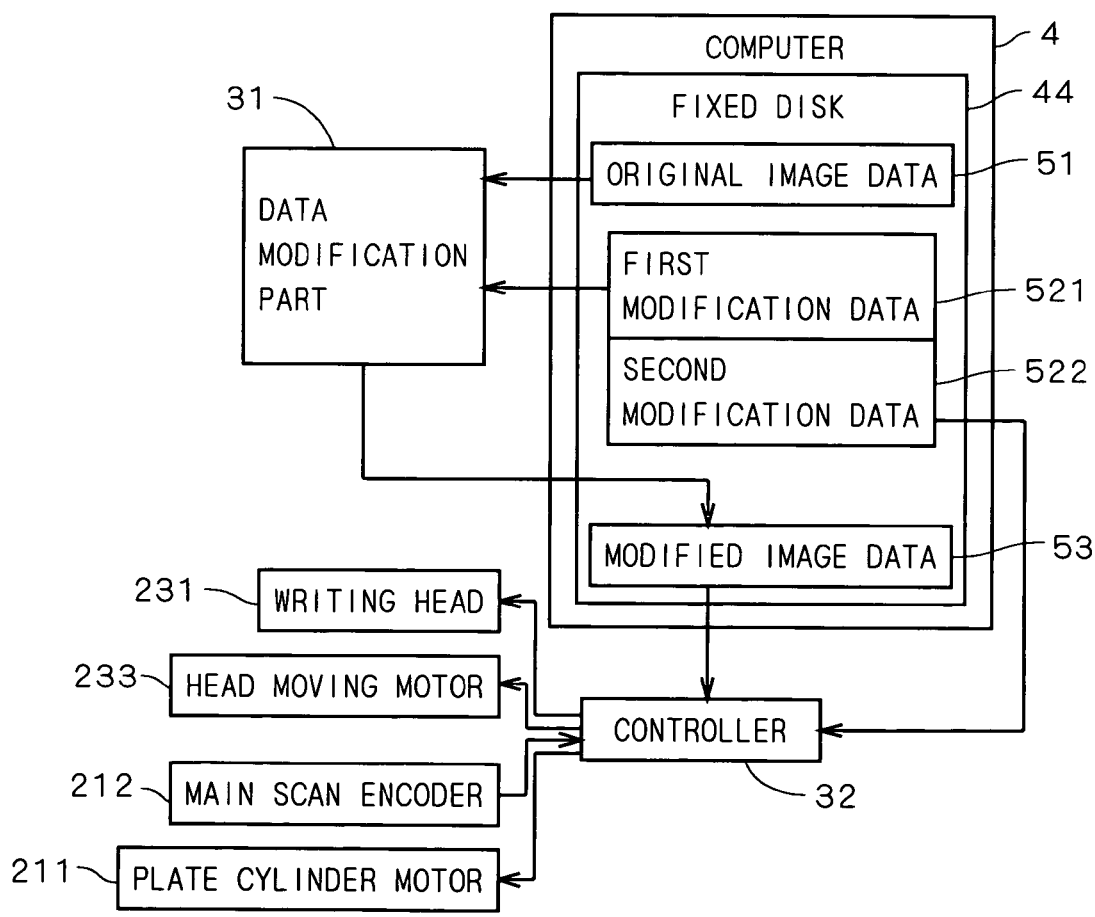
FIG. 3 is a block diagram showing a constitution relating to recording of an image onto a printing plate.

FIG. 3 is a block diagram showing a constitution relating to recording of an image onto the printing plate 91. A plate-making apparatus in the printing unit 11 is constituted of the constitution shown in FIG. 3, the plate cylinder 21, the developing part 24, and the like. As discussed earlier, a computer 4 is connected to the main body of printing apparatus 1, and in a fixed disk 44 of the computer 4, data 51 of an image to be written on the printing plate 91 (image data before modification, and hereinafter, referred to as "original image data"), first modification data 521 used for modification before writing and second modification data 522 used for modification in writing are stored. Immediately before writing, as required, modified image data 53 obtained by modification is stored in the fixed disk 44.

The data modification part 31 is a dedicated electric circuit for generating the modified image data 53 from the original image data 51 by computation on the basis of the first modification data 521, and provided in the main body of printing apparatus 1 or the computer 4. The function of the data modification part 31 may be implemented on software by execution of program with the computer 4.

The controller 32 controls the constituent elements in the main body of printing apparatus 1, and FIG. 3 shows a state where the writing head 231 and the head moving motor 233 which are used for writing onto the printing plate 91 (see FIG. 2), the plate cylinder motor 211 for rotating the plate cylinder 21 in writing and the main scan encoder 212 (including a switch for sensing an original point) for sensing the rotational position of the plate cylinder motor 211 are connected to the controller 32. The plate cylinder motor 211 rotates the plate cylinder 21 relatively to the writing head 231 to scan the irradiation positions of the light beams from the writing head 231 on the printing plate 91 in the main scan direction.

The controller 32 receives a signal from the main scan encoder 212 to control the writing head 231 to emit the light beams and the head moving motor 233 to move the writing head 231 in the subscan direction, on the basis of the signal, while driving the plate cylinder motor 211. As discussed later, the second modification data 522 is inputted to the controller 32 in writing, and modification of writing (i.e., shifting of writing timing) in the main scan direction is performed on hardware.

Figure 4A:
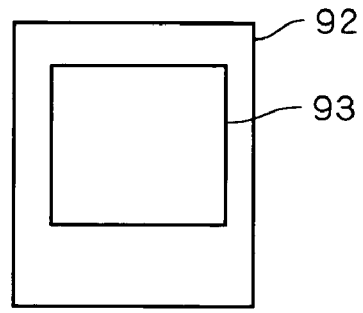
FIG. 4A is a view showing an image printed assuming that paper is not deformed in printing.
Figure 4B:
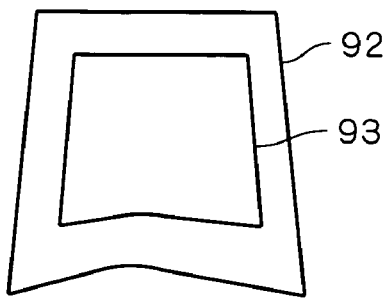
FIG. 4B is a view showing the image after the paper is deformed.

Next, referring to FIGS. 4A and 4B, 5A and 5B, and 6A to 6C, discussion will be made on why the modification of writing should be performed and how it is done in outline. FIG. 4A is a view showing a state where an image 93 (in other words, a content to be printed) is printed assuming that the paper 92 is not deformed in printing, and FIG. 4B is a view showing the image 93 in a case where the paper 92 is deformed in printing. The deformation of the paper 92 in printing, i.e., fan-out, is caused mainly by dampening water and the paper 92 is slightly expanded to be like a trapezoid (extending in a printing direction (vertical direction in FIG. 4B) on the whole, with its end side in the printing direction (lower side in FIG. 4B) extended in a direction orthogonal to the printing direction). FIG. 4B shows an exaggerated deformation of the paper 92. Such a deformation also depends on a pattern (content) of the image 93. With deformation of the paper 92, the image to be printed is deformed as shown in FIG. 4B.

Further, the deformation of the paper 92 raises a big problem that the antecedent printing and the precedent printing have different printing range in multicolor printing. As a result, images by colors do not coincide with one another and printing quality is thereby deteriorated.

Figure 5A:
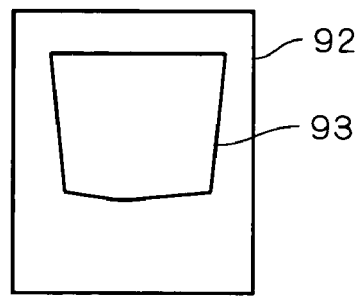
FIG. 5A is a view showing a modified image printed assuming that paper is not deformed.
Figure 5B:
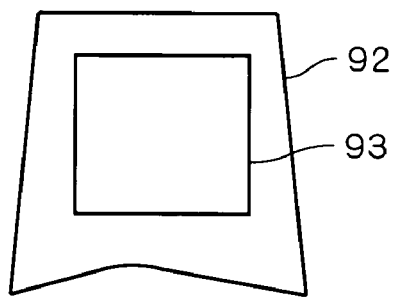
FIG. 5B is a view showing the modified image after the paper is deformed.

FIG. 5A is a view showing a modified image 93 printed assuming that the paper 92 is not deformed, in other words, showing an image to be recorded onto the printing plate 91, and FIG. 5B is a view showing the modified image 93 after the paper is deformed. In the printing apparatus 1, by modifying the image to be recorded onto the printing plate 91 as shown in FIG. 5A, it is possible to obtain the image 93 of appropriate shape after printing as shown in FIG. 5B.

Figure 6A:
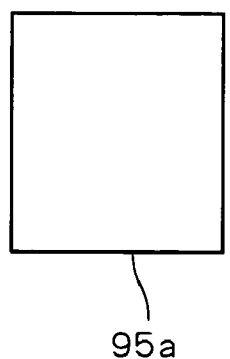
FIGS. 6A to 6C are view used for explaining an outline of modification.
Figure 6B:
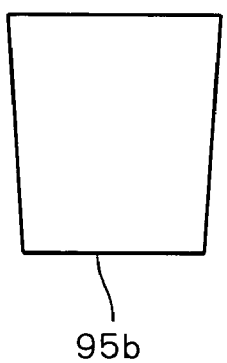
Figure 6C:
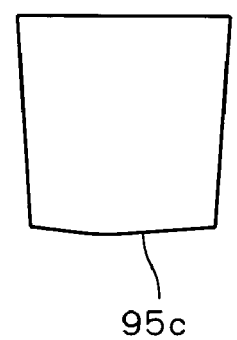

FIGS. 6A to 6C are view used for explaining an outline of modification performed in the printing apparatus 1. When an image 95a of original image data 51 to be printed has a rectangular shape as shown in FIG. 6A, first in printing, the data modification part 31 generates modified image data 53 indicating an image 95b with its end side contracted by using the first original image data 521 in consideration of extension of the paper at its end side of the printing direction in a direction orthogonal to the printing direction. Then, in writing, the controller 32 modifies writing in the main scan direction (corresponding to the printing direction) by using the second modification data 522, to perform writing in consideration of extension of the paper in the printing direction in printing as shown in FIG. 6C, and an image 95c with its length in the main scan direction contracted is recorded onto the printing plate 91. This achieves the printing as shown in FIG. 5B.

Figure 7:
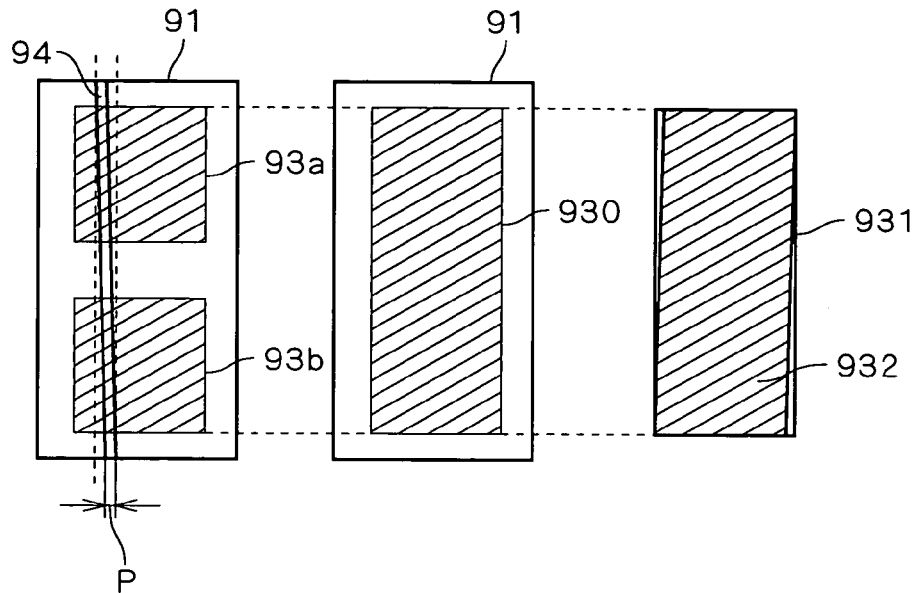
FIG. 7 is a view used for explanation of spiral modification.

In an actual image recording, two images are recorded onto one printing plate 91. Spiral modification is performed by the data modification part 31, for spiral exposure to continuously move the writing head 231 in the subscan direction in recording. The left part of FIG. 7 shows a state where two images 93a and 93b for two-color printing are recorded onto one printing plate 91. In the printing apparatus 1, modification is performed on each of the two images 93a and 93b to prevent fan-out, and the image data to be used is data indicating image in a region 930 including the images 93a and 93b as shown in the central part of FIG. 7. FIG. 7 ignores the modification against fan-out.

A region in FIG. 7 represented by reference sign 94, lying between two straight lines, is a region scanned by the writing head 231 while the plate cylinder 21 is rotated once, and reference sign P represents a distance covered by the writing head 231 in the subscan direction in this period. In the spiral modification generated is data indicating an image 931 obtained by shearing the region 930 in consideration of inclination of the region 94 (a hatched region 932 corresponds to the region 930).

Next, discussion will be made in more detail on operations for plate making and printing in the printing apparatus 1. In the following discussion, for simple understanding, it is assumed that one image modified to prevent fan-out is recorded onto one printing plate 91.

Figure 8:
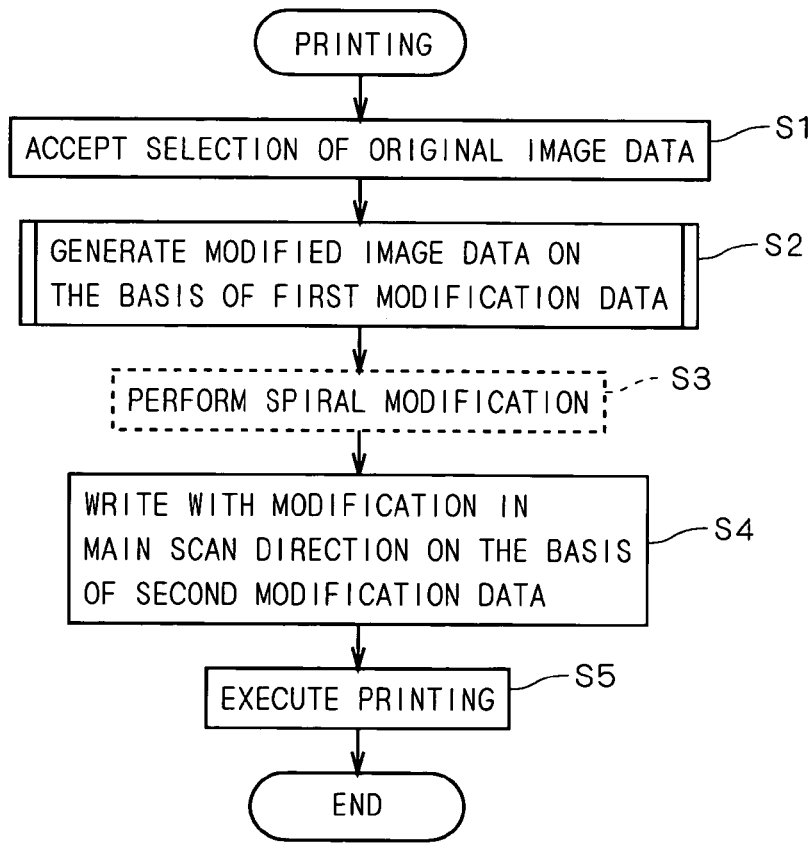
FIG. 8 is a flowchart showing the whole operation of the printing apparatus.

FIG. 8 is a flowchart showing the whole operation of the printing apparatus 1. First, a user operates a keyboard, a mouse or the like of the computer 4 to select the original image data 51 to be printed out (see FIG. 3). When the computer 4 receives the information on this selection (Step S1), the first modification data 521 and the second modification data 522 (these data are prepared in advance by a method discussed later) associated with the original image data 51 are specified. Then, the first modification data 521 is transmitted to the data modification part 31, to generate the modified image data 53 (Step S2).

Figure 9:
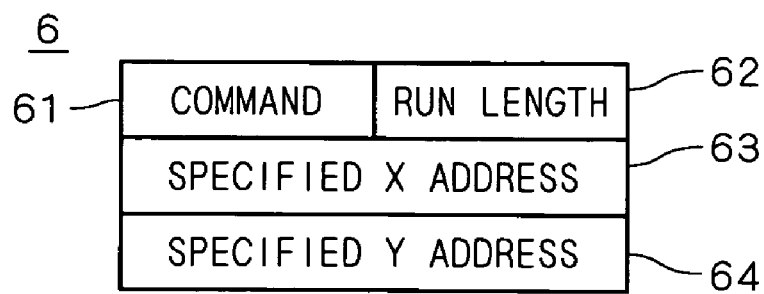
FIG. 9 is a view showing a command block.

The first modification data 521 is a set of command blocks. FIG. 9 is a view showing a command block 6. The command block 6 includes a command 61, a run length 62, a specified X address 63 and a specified Y address 64, carrying information of 6 bytes. For modification on the basis of the first modification data 521, in principle, each value (1 bit) of pixel in the original image is transmitted to a memory area (hereinafter, referred to as "modified image space") in which a modified image defined in advance is stored and written therein, according to the command 61. At this time, the transmission of pixel value is performed in a unit of 8 pixels (i.e., 1 Byte) aligned in the main scan direction. In the following discussion, the transmission and writing of pixel value is referred to simply as "transmission of pixel".

Figure 10:
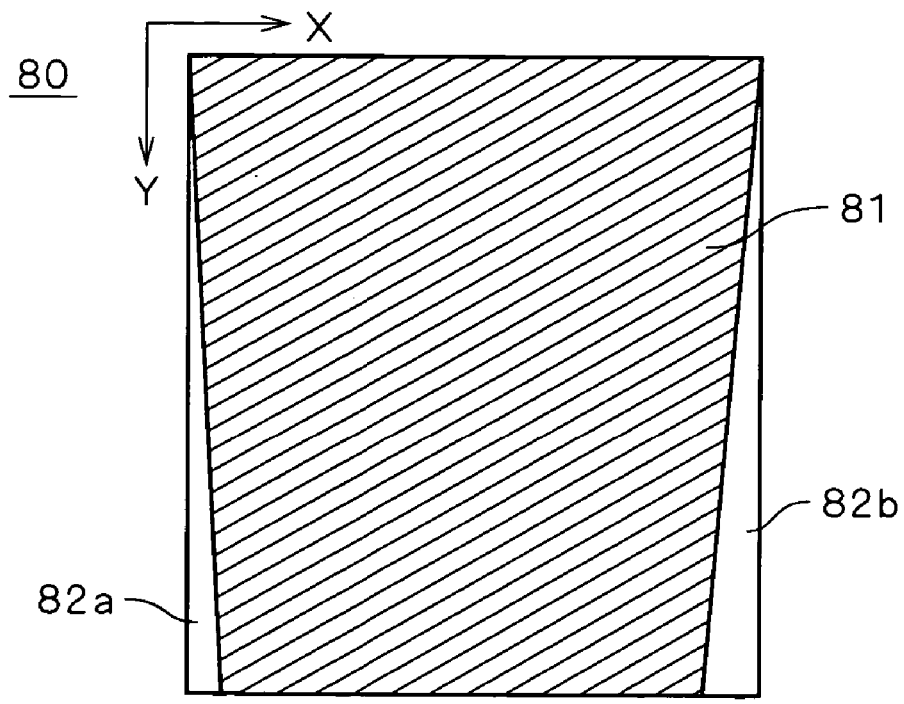
FIG. 10 is a view illustrating a modified image space.

FIG. 10 is a view illustrating the modified image space 80 at the time when the transmission of pixel in the original image is finished. In FIG. 10, a hatched region 81 represents a region to which the pixels in the original image are transmitted and blank regions 82a and 82b on the right and left correspond to distortions of the original image by modification. The region 81 corresponds to the image 95b shown in FIG. 6B. Thus, the modified image is an image including the original image modified in width in the subscan direction, in other words, an image obtained by substantially modifying the width of the original image in the subscan direction.

Figure 11:
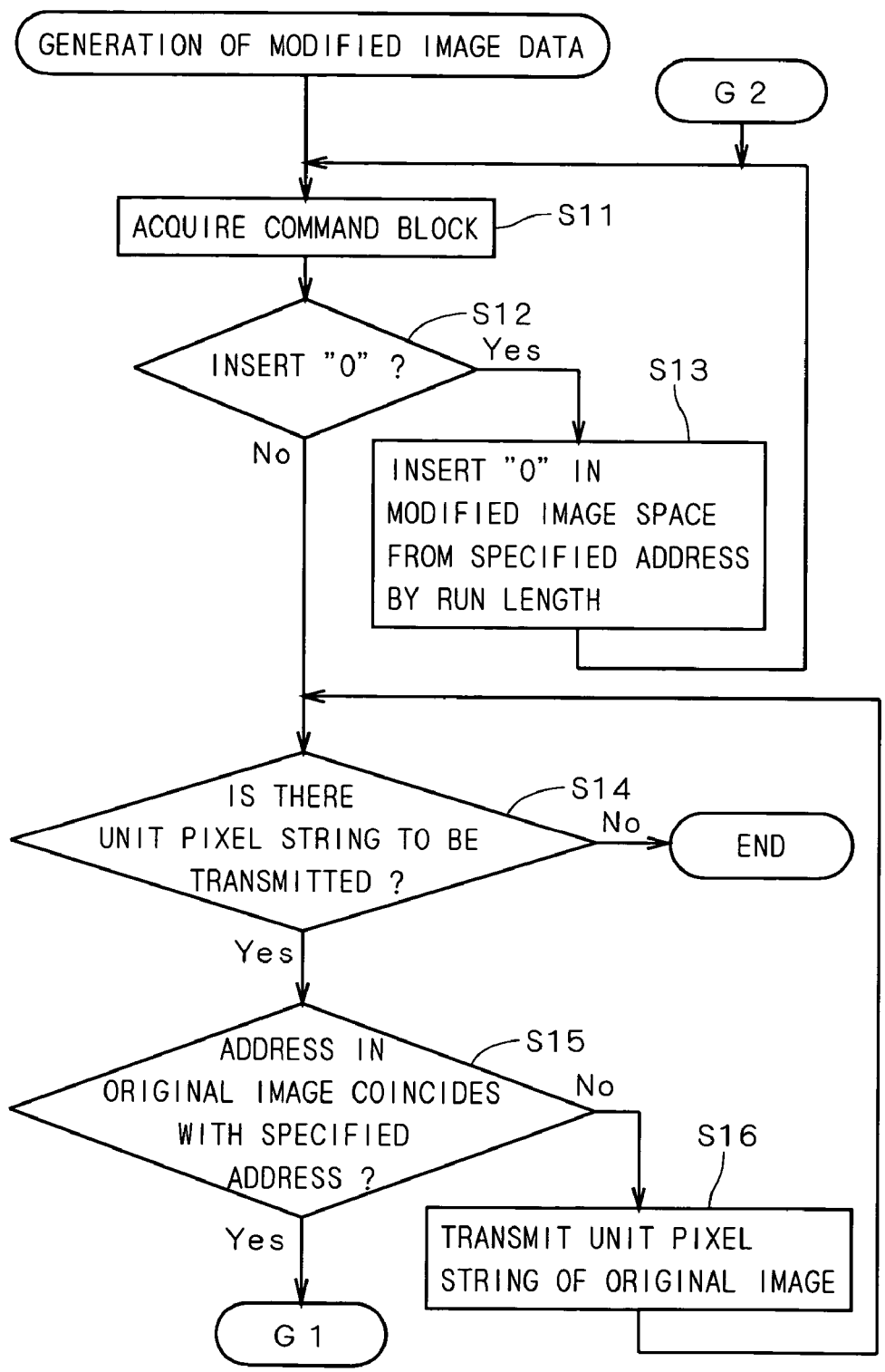
FIGS. 11 and 12 are flowcharts showing an operation for generating modified image data in detail.
Figure 12:
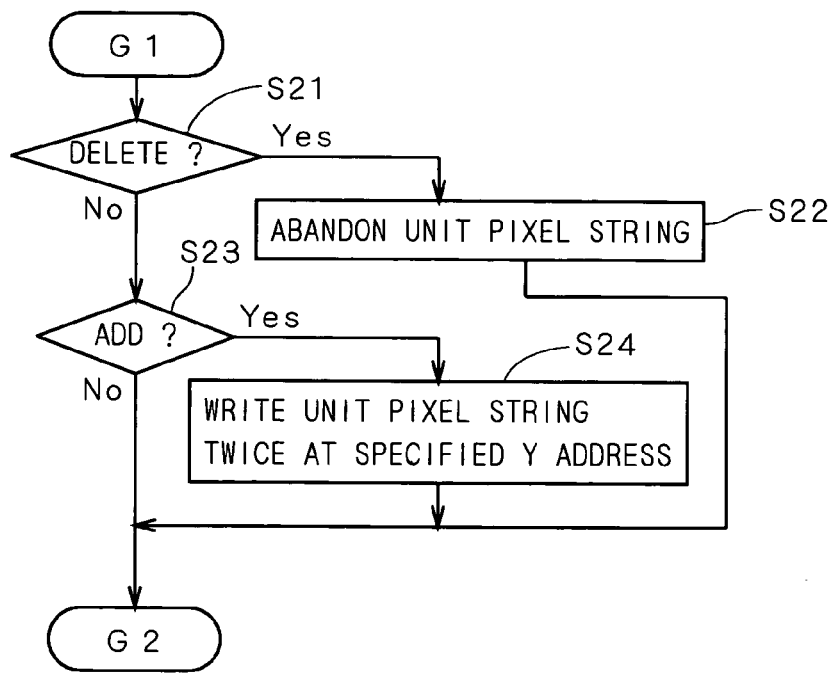

FIGS. 11 and 12 are flowcharts showing an operation for generating the modified image data 53 in detail. First, a command block 6 is acquired from the first modification data 521 and registered in a predetermined register (Step S11). There are three types of commands 61, i.e., "insert "0"", "delete" and "add", and the commands 61 of the command blocks 6 in the initial part of the first modification data 521 indicate "insert "0"".

When the data modification part 31 recognizes that a command 61 indicates "insert "0"" (Step S12), the specified X address 63 and the specified Y address 64 of the command block 6 are acquired. In the command block 6 having the command 61 for "insert "0"", the specified X address 63 indicates a specified value of an X address (in a unit of bit) in the subscan direction of the modified image space 80 and the specified Y address 64 indicates a specified value of a Y address (in a unit of Byte) in the main scan direction of the modified image space 80 (see X and Y in FIG. 10).

From a position in the modified image space 80 which is specified by the specified X address 63 and the specified Y address 64 (hereinafter, referred to as "specified address"), "0"s are inserted into the modified image space 80 by the number of Bytes indicated by the run length towards a direction where the Y address increases (Step S13). Repeating acquisition of a command block 6 and insertion of "0" (Steps S11 to S13), the blank region 82a on the left side of the modified image space 80 shown in FIG. 10 is formed.

Figure 13:
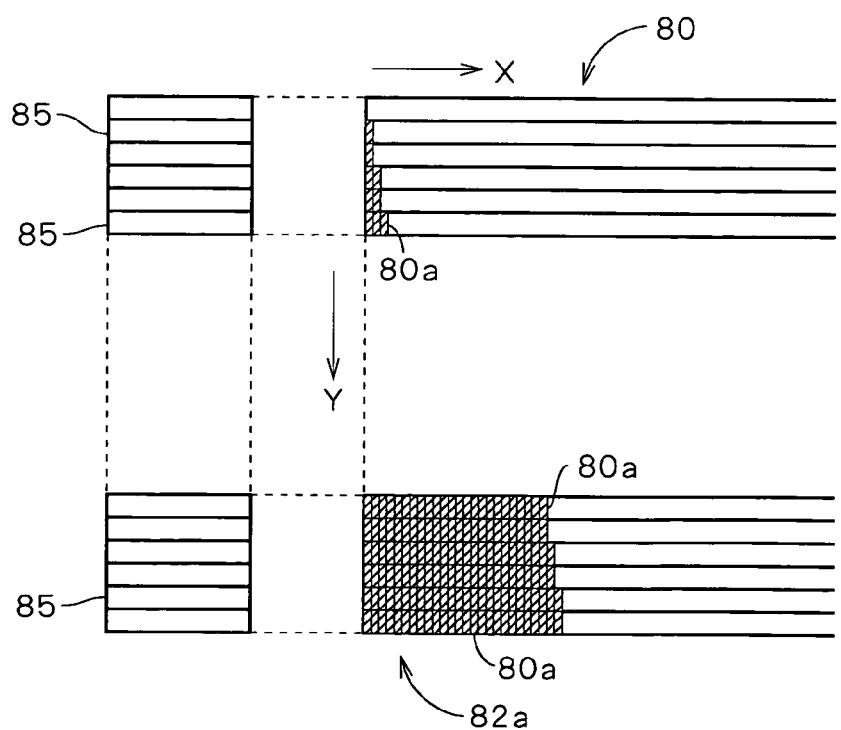
FIG. 13 is an enlarged view showing a state where a blank region is formed.

FIG. 13 is an enlarged view showing a state where the blank region 82a is formed. In the modified image space 80, a string of 8 pixels (i.e., 1 Byte) aligned in the Y direction (hereinafter, referred to as "unit pixel string 80a") is a unit of handling, and as discussed above, "0"s are inserted in the unit pixel strings 80a as many as the number indicated by the run length, according to the command 61 indicating "insert "0"". When a plurality of insertions of "0" are performed at one Y address by repeating execution of the command 61, in principle, "0"s are sequentially inserted in the modified image space 80 towards a direction where the X address increases. In other words, in the first modification data 521, the later the command block 6 for "insert "0"" lies, the larger the value of the specified X address 63 becomes.

On the other hand, each Y address is associated with an X-address counter 85, and when write is performed for one unit pixel string 80a, the X-address counter 85 associated with the Y address of this unit pixel string 80a is incremented by 1 (1 is added to the counter). The X address at which write is performed at last in each Y address is thereby stored in the X-address counter 85.

There may be a case where the specified X address 63 is omitted from the command block 6 for "insert "0"" and the X address at which write is to be performed is specified with reference to the X-address counter 85. There may be another case where "0"s are written into all the addresses (positions) in the modified image space 80 in initialization and only increment of the X-address counter 85 is performed in response to the command block 6 for "insert "0"".

When read of the command blocks 6 for "insert "0"" in the initial part of the first modification data 521 is finished, next, a command block 6 including the command 61 indicating "delete" or "add" is acquired from the first modification data 521 (Step S11). In the command block 6 having the command 61 of "delete" or "add", the specified X address 63 indicates a specified value of an X address in a unit of bit in the subscan direction of the original image and the specified Y address 64 indicates a specified value of a Y address in a unit of Byte in the main scan direction of the original image.

Next, unit pixel strings 80*a* (exactly, data indicating the unit pixel string 80*a* of the original image data 51) are sequentially transmitted to the modified image space 80 (Step S14 to S16) while it is checked if a unit pixel string 80*a* to be transmitted is present in the original image and if the X address and the Y address of the unit pixel string 80*a* in the original image coincide with the specified X address 63 and the specified Y address 64 in the command block 6, respectively. At this time, the unit pixel strings 80*a* are sequentially transmitted while the Y address is incremented by 1 from the unit pixel string 80*a* located at the minimum X address and the minimum Y address in the original image, and when all the unit pixel strings 80*a* aligned in one X address are transmitted, the X address is incremented by 1 and the unit pixel strings 80*a* are transmitted again while the Y address is incremented. In other words, the position of the unit pixel string 80*a* to be transmitted in the original image is moved in the subscan direction every time when the movement in the main scan direction is finished.

The Y address of a transmission destination in the modified image space 80 coincides with the Y address of the unit pixel string 80*a* in the original image and the X address of the transmission destination coincides with an address obtained by adding 1 to a value of the X-address counter 85, and the transmission is performed, the X-address counter 85 corresponding to the Y address of the transmission destination is incremented by 1.

When the address of the unit pixel string 80*a* to be transmitted in the original image (i.e., position specified by the X address and the Y address) coincides with the specified address (i.e., the specified X address 63 and the specified Y address 64) (Step S15), it is checked whether the command 61 is "delete" or "add" (FIG. 12: Steps S21 and S23).

Figure 14:
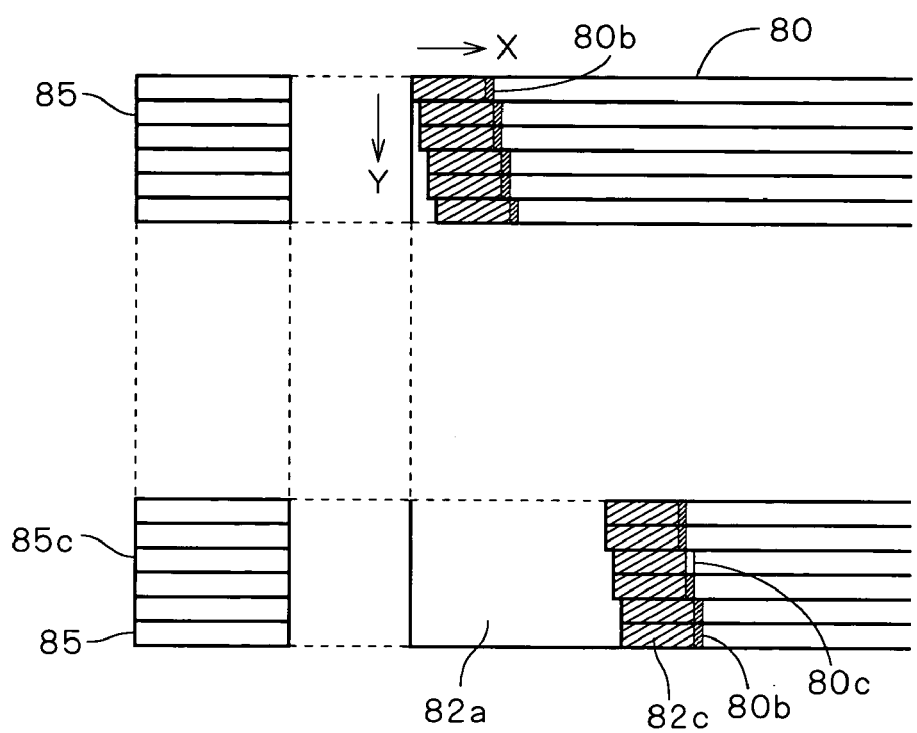
FIG. 14 is a view showing a state where a unit pixel string is not transmitted.

When the command 61 indicates "delete", the unit pixel string 80*a* is not transmitted to the modified image space 80 and abandoned (in other words, the next unit pixel string 80*a* to be transmitted is updated) (Step S22). FIG. 14 is a view showing a state where a unit pixel string 80*a* is not transmitted. In FIG. 14, a region 82*c* is a set of unit pixel strings 80*a* which are already transmitted from the original image and positioned adjacently to the blank region 82*a*. A plurality of unit pixel strings 80*b* adjacent to the (+X) side of the region 82*c* are those which have been aligned in the Y direction at one X address in the original image, being hatched differently from the region 82*c*.

In FIG. 14, the transmission of the unit pixel string 80*a* to a position indicated by reference sign 80*c* is not performed since the address of the unit pixel string 80*a* in the original image coincides with the specified address of the command 61 indicating "delete". Therefore, the X-address counter 85 corresponding to the position 80*c* is not incremented. Thus, in response to the command 61 for "delete", part of the unit pixel strings 80*a* is abandoned when the original image is transmitted to the modified image space 80.

Figure 15:
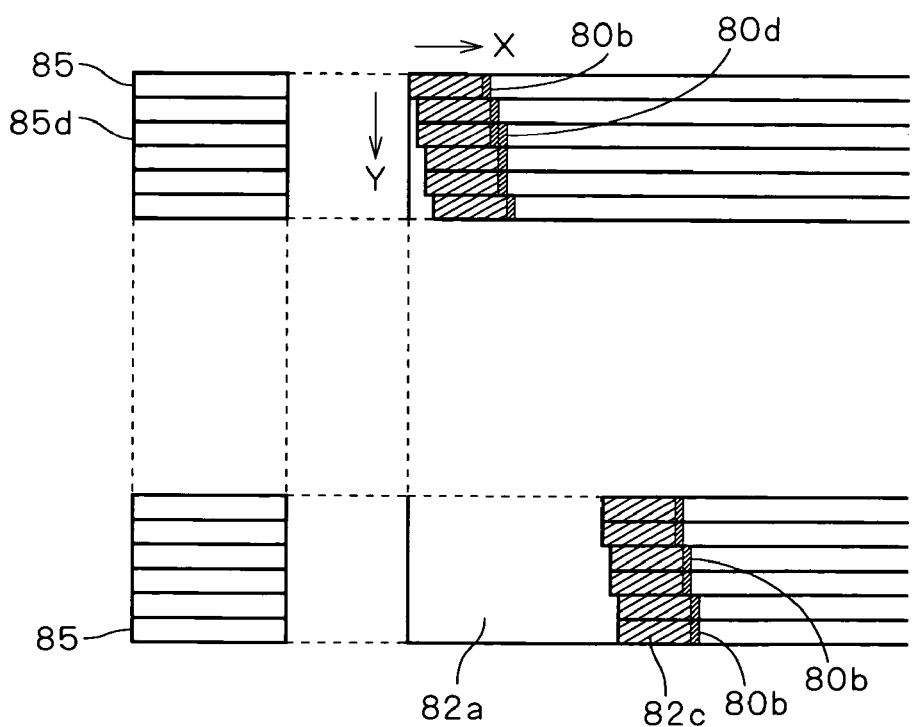
FIG. 15 is a view showing a state where a unit pixel string is written twice.

When the command 61 indicates "add", the unit pixel string 80*a* to be transmitted is written in the specified Y address 64 twice (Step S23 and S24). FIG. 15 is a view showing a state where the unit pixel string 80*a* is written twice. Also in FIG. 15, a plurality of unit pixel strings 80*b* adjacent to the (+X) side of the region 82*c* in the unit pixel string 80*a* which are already transmitted have been aligned in the Y direction at one X address in the original image. The unit pixel string represented by reference sign 80*d* is equivalent to the unit pixel string 80*b* adjacent to the (−X) side and is one written in the double write. At this time, the X-address counter 85 corresponding to the unit pixel string 80*d* is incremented by 2. Thus, in response to the command 61 for "add", part of the unit pixel string 80*a* is substantially extended in the subscan direction when the original image is transmitted to the modified image space 80.

When "delete" or "add" of the unit pixel string 80*a* is finished, a next command block 6 is acquired back in Step S11 and "delete" or "add" of the unit pixel string 80*a* is performed as appropriate while transmission of the unit pixel string 80*a* is repeated. Then, when all the command block 6 are acquired and the operations according to all the command 61 are finished, transmission of the unit pixel string 80*a* is repeated until no unit pixel string 80*a* to be transmitted remains.

When all the unit pixel strings 80*a* are transmitted to the modified image space 80, the remaining region in the modified image space 80 is filled with "0", forming the region 82*b* shown in FIG. 10, and the modification according to the first modification data 521 is thereby finished (Step S14). Write of "0" to the region 82*b* may be included in the last part of the first modification data 521 as commands for "insert '0'". When "0"s are written to the whole modified image space 80 in initialization, the last write of "0" may be omitted.

Thus, the first modification data 521 is data instructing the processing in transmission of the original image to the modified image space 80, and has commands to insert "0" (blank) to an end portion on the (−X) side of the modified image space 80 in the subscan direction and commands to delete or add of pixels in aligning the pixels of the original image from the end portion on the (−X) side towards an end portion on the opposite side ((+X) side) with following the blank. According to the first modification data 521, as shown in FIG. 10, a modified image is generated by freely modifying the width (i.e., widths at Y addresses) of the original image in the X direction (corresponding to the subscan direction) and the modified image data 53 is stored in the fixed disk 44. Since the region 82*a* serves as a reference for alignment of the unit pixel strings 80*a* in the first row in the modified image space 80, the command blocks 6 for "insert '0'" in the initial part of the first modification data 521 are substantially data indicating the distortion of the original image in the modified image.

The above-discussed spiral exposure needs spiral modification for distorting an image to be recorded in plate making as shown in FIG. 7. Then, the data modification part 31 distorts the original image more than usual by the spiral modification in insertion of "0" and thereby substantially eliminates necessity of the spiral modification. Therefore, the spiral modification in Step S13 of FIG. 8 is usually omitted in the data modification part 31. In the printing apparatus 1, actually, arranging images on a plate (similar to step and repeat process) for two-color printing is performed by the data modification part 31 at the same time.

When the modified image data 53 is prepared, the controller 32 performs writing onto the printing plate 91 while performing modification in the main scan direction on the basis of the second modification data 522 (FIG. 8: Step S4).

As a result, such an image as illustrated in FIG. 6C, which is modified to prevent fan-out, is recorded on the printing plate 91.

Figure 16:
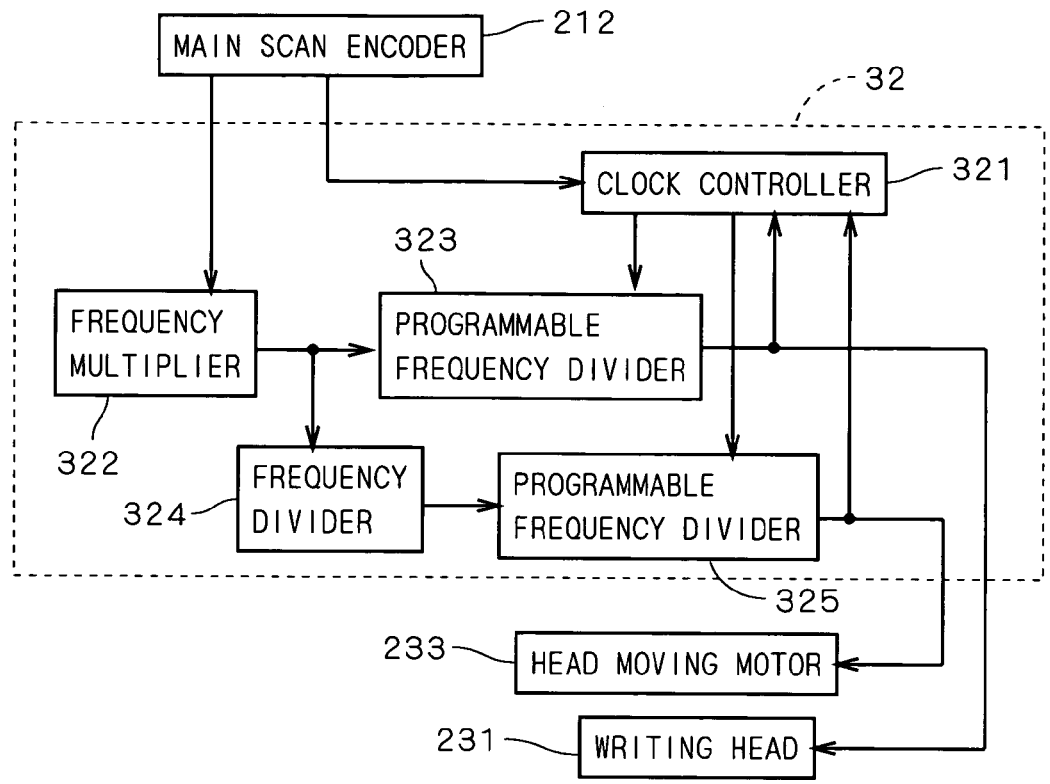
FIG. 16 is a block diagram showing a constitution of a controller.

FIG. 16 is a block diagram showing a constitution of the controller 32. FIG. 16 does not show a constitution for transmission of the modified image data 53 to the writing head 231 together with the writing clock.

The controller 32 has a clock controller 321 receiving the second modification data 522, a frequency multiplier 322, a programmable frequency divider 323 for generating the writing clock for the main scan direction, a frequency divider 324 and a programmable frequency divider 325 for generating a moving clock for movement of the writing head 231 in the subscan direction. These constituent elements achieves synchronization between the scan of the irradiation positions of the light beams in the main scan direction and that in the subscan direction. Emission of the light beams from the writing head 231 is controlled in synchronization with these scans.

Figure 17:
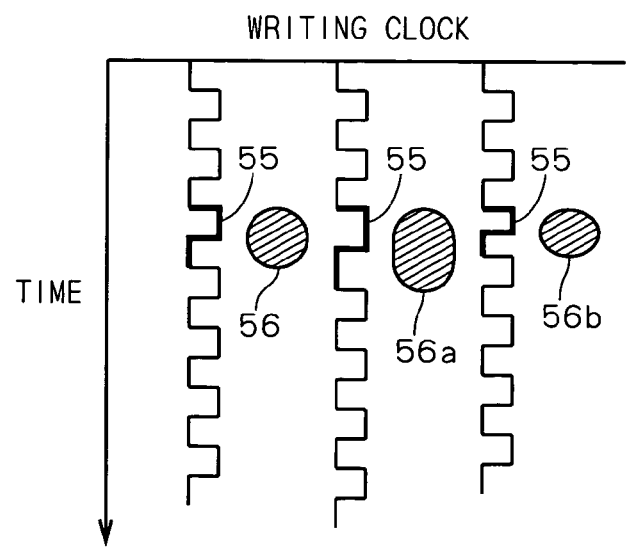
FIG. 17 is a view showing a state where a cycle of writing clock is shifted.

The frequency multiplier 322 multiplies a signal from the main scan encoder 212 mounted on the plate cylinder 21 and the programmable frequency divider 323 divides the multiplied signal. Through these operations generated is a writing clock which is pulses each used for writing of a pixel (1 bit) in the main scan direction. At this time, a division ratio is controlled in response to a signal from the clock controller 321. As a result, as shown in FIG. 17, the cycle of the writing clock 55 is changed to shift a writing timing and the length of a dot 56 to be written in the main scan direction is changed to be dot 56a or 56b. This makes it possible to change the length of each pixel in the main scan direction in writing in a range less than the usual length of a pixel.

Figure 18:
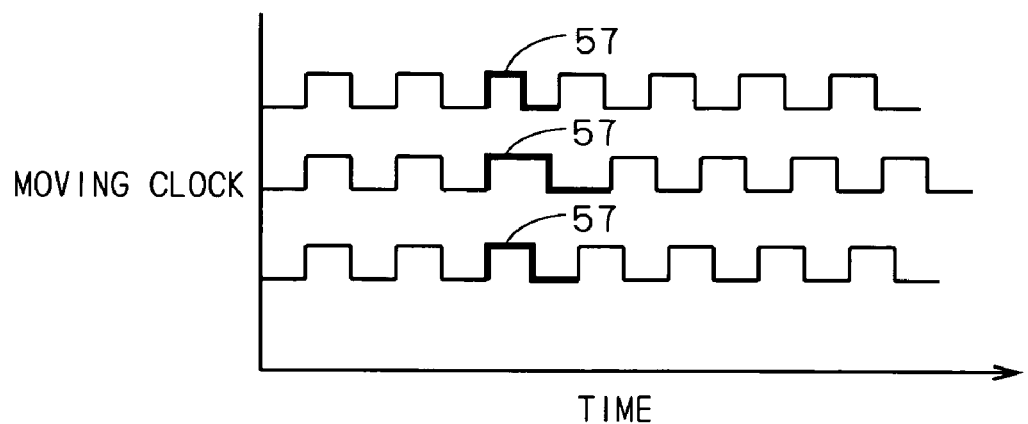
FIG. 18 is a view showing a state where a cycle of moving clock is shifted.

On the other hand, the multiplied signal is divided by the frequency divider 324, and the moving clock for the head moving motor 233 is generated by the programmable frequency divider 325. The moving clock is a clock signal for continuously moving the writing head 231 in spiral exposure. This also makes it possible to change the cycle of the moving clock 57 by control of the clock controller 321 as shown in FIG. 18.

Figure 19:
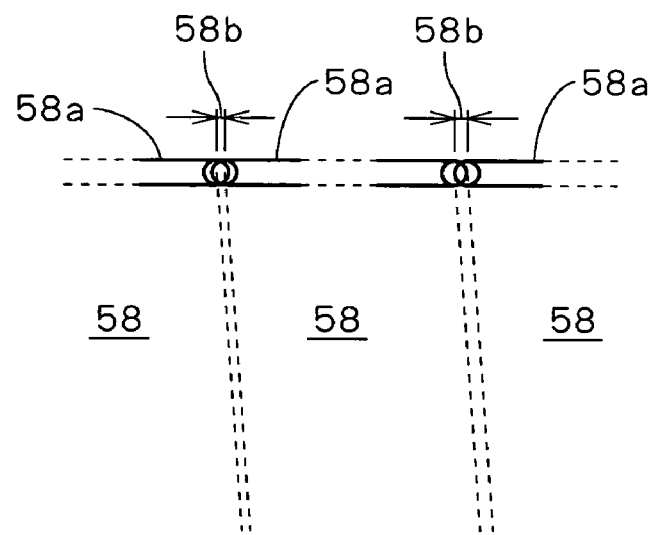
FIG. 19 is a view showing regions irradiated with an array of light beams through main scan.

FIG. 19 is a view showing regions 58 irradiated, through one main scan, with an array 58a of light beams emitted from the writing head 231, being aligned in the subscan direction. By shifting the moving clock, it becomes possible to change the width 58b of an overlapping portion of the adjacent regions 58 in a range less than a width of one pixel or less. Since an image recorded as the modified image data 53 has width (i.e., widths at Y addresses) modified in the subscan direction, if high-precision modification is not required, it is not necessary to shift the moving clock.

With shift of the timing for write in the main scan direction by the controller 32 (and the moving timing in the subscan direction, if necessary), the length (i.e., a length at each X address) of an image recorded on the printing plate 91 on the basis of the modified image data 53 is changed. As a result, the image 95b shown in FIG. 6B is modified to be the one shown in FIG. 6C and the image modified to prevent fan-out is recorded on the printing plate 91.

In the printing apparatus 1, actually, since one printing plate 91 has two image regions, the modified image data 53 including two image regions with their width in the subscan direction modified, in consideration of the spiral exposure, is generated and shift of the writing timing (including change of the number of writing clocks) is so performed as to independently change the length of each image region in the main scan direction in writing.

When plate making is finished in each of the printing unit 11a and 11b, four-color printing is performed on papers (FIG. 8: Step S5) as discussed earlier. The multicolor printing can be performed while misregistration of printing positions by colors due to fan-out, especially, extension of paper with dampening water, is prevented.

Since the modified image data 53 is generated by simple operations of "insert "0"", "delete" and "add" with the first modification data 521 which is a set of command blocks 6 in the printing apparatus 1, it is possible to quickly start printing only if the original image data 51, the first modification data 521 and the second modification data 522 are stored. As a result, it is not necessary to prepare the whole data of modified images to be recorded (by types of paper, for example) in the fixed disk 44 in advance, and it is possible to efficiently use the memory area.

In a case of recording a binary image at 2400 dpi in the image region having a size of 330 mm×460 mm, for example, the amount of data for the whole image is about 250 MByte, but assuming that one command block 6 has 6 Bytes and 100 pixels are deleted at a lower end of FIG. 10 to make the total width of the left and right blank regions 82a and 82b 100 pixels, the first modification data 521 has a size of about 3.2 MBytes. Since the degree of fan-out varies paper by paper, it is unrealistic to prepare data of images which are modified paper by paper.

Figure 20:
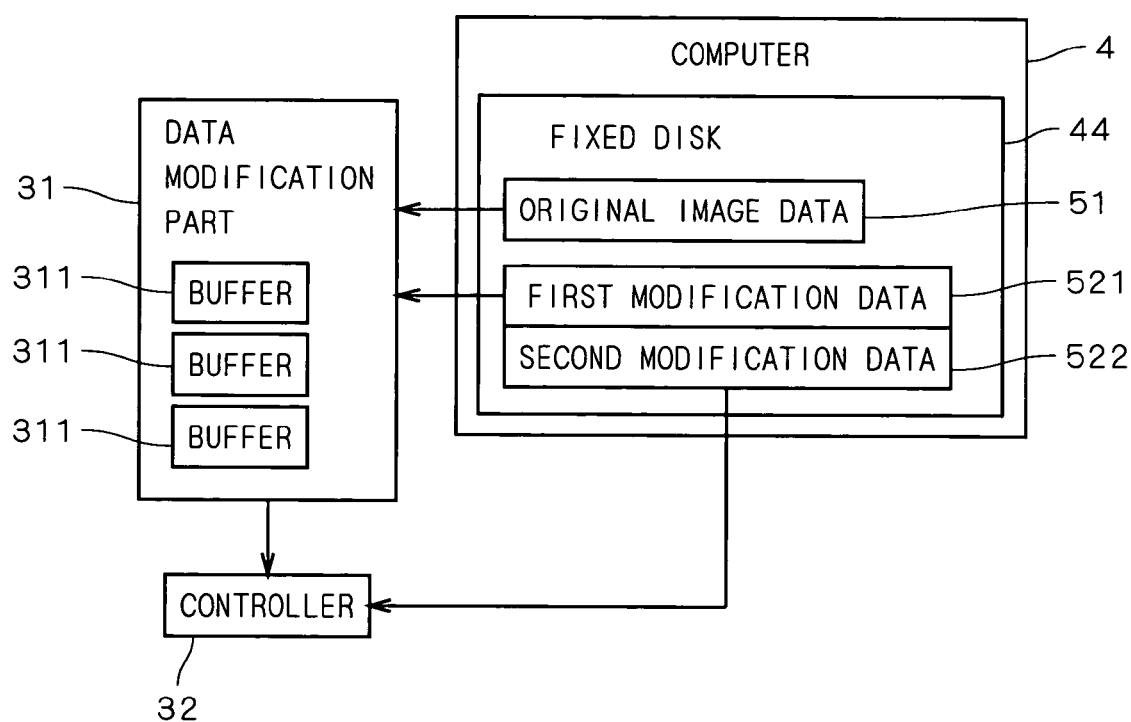
FIG. 20 is a block diagram showing another exemplary constitution of data modification part.

FIG. 20 is a block diagram showing another exemplary constitution of the data modification part 31. The data modification part 31 of FIG. 20 has three buffers 311, and each buffer 311 has capacity large enough to record an image with width sufficiently larger than the width in the subscan direction of one blank region (the region 82a or region 83a in FIG. 10) in the modified image and length equal to that of the modified image in the main scan direction.

In writing, the command blocks 6 are sequentially read out from the first modification data 521 and data of part of the modified image (part at the end on the (−X) side) is stored in the buffer 311. Then, data of next part of the modified image is stored in the next buffer 311. When data of further next part of the modified image is stored in the third buffer 311, the stored data and part of the second modification data 522 are sequentially transmitted from the buffer 311 in which the first storing is performed to the controller 32 and recording of image onto the printing plate 91 is started. Then, by repeating the storing of data of part of the modified image into the buffer 311 and transmission of data from the other buffer 311 to the controller 32 (in a toggle system), recording of image onto the printing plate 91 is performed without storing the whole modified image data 53 into the fixed disk 44.

This allows quick start of image recording after the user gives instruction of starting printing, and it is thereby possible to reduce the time required for the whole printing operation.

Next, discussion will be made on a method of generating the first modification data 521 and the second modification data 522 (hereinafter, referred to generally as "modification data").

Figure 21:
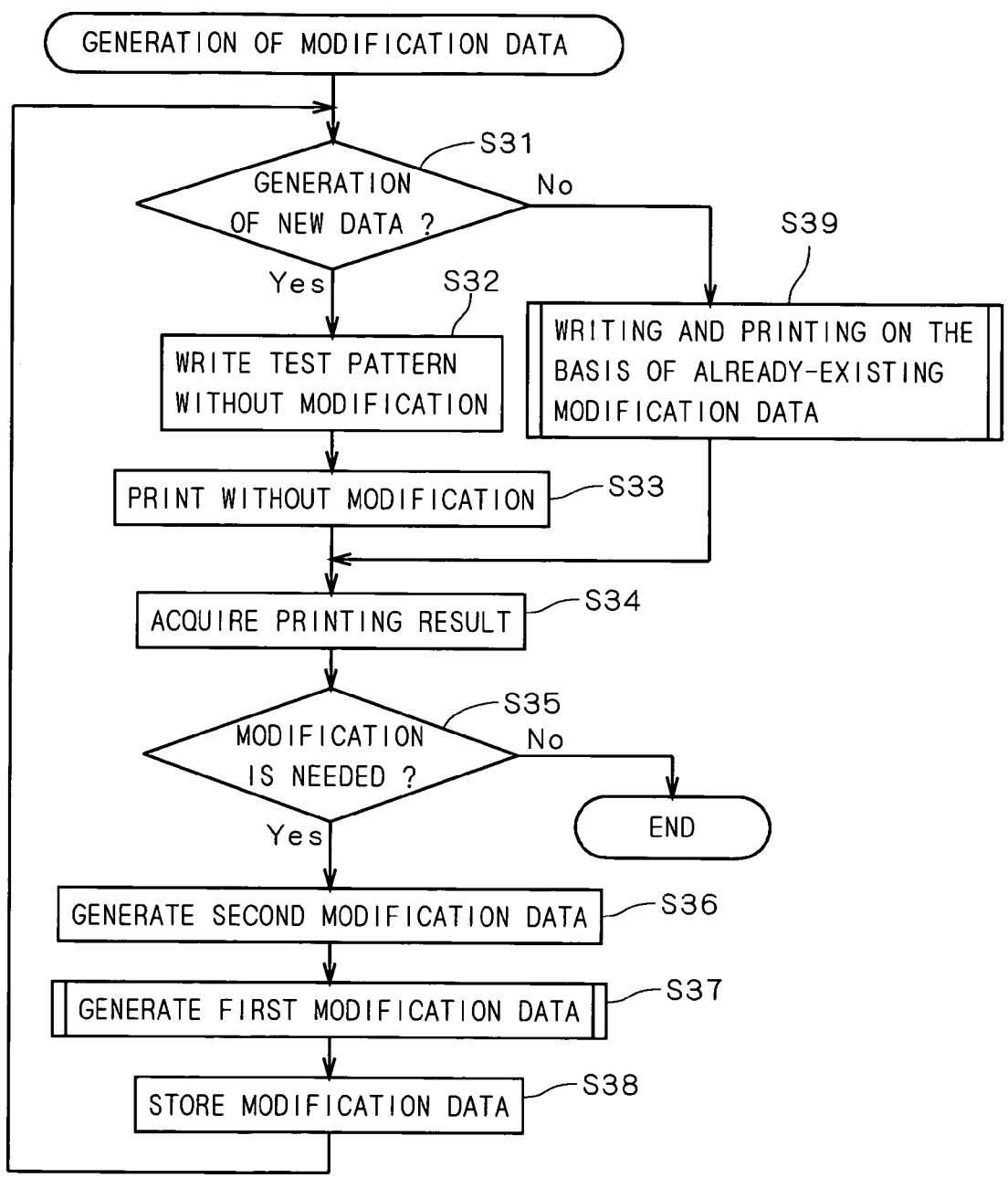
FIG. 21 is a flowchart showing an operation for generating modification data.

FIG. 21 is a flowchart showing an operation for generating modification data. In generation of modification data, first, it is checked whether new modification data should be generated or not (Step S31), then if new modification data should be generated, a test pattern which is prepared in advance is written on the printing plate 91 without modification (Step S32) and printing is performed without modification (Step S33).

In the printing apparatus 1, an image pickup of the paper 92b after printing is performed by the image pickup part 142 while the paper 92b is transferred, being held by the belt 141 of FIG. 1, and the acquired image is automatically transmitted to the computer 4 and stored as a printing result (Step S34).

Figure 22A:
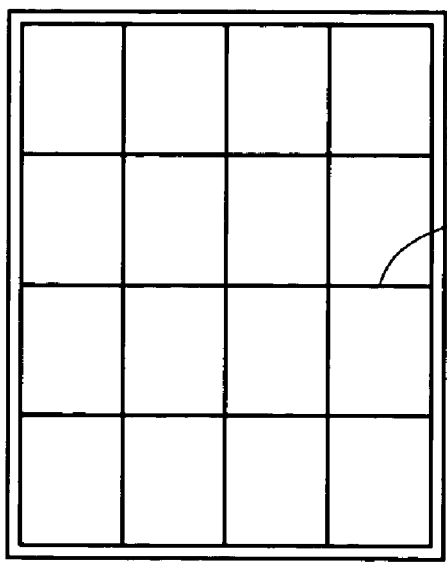
FIGS. 22A and 22B are views showing test patterns.
Figure 22B:
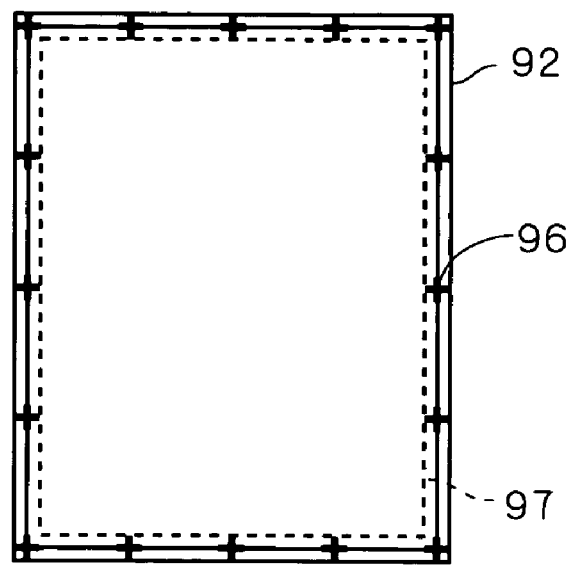

FIGS. 22A and 22B are views showing a test pattern 96 on the paper 92 (with distortion of the paper 92 ignored). FIG. 22A shows a lattice-like test pattern 96, and FIG. 22B shows a test pattern 96 in which a predetermined content (e.g., pattern, picture or the like) 97 is printed in the center and register marks are arranged on the periphery.

Next, the second modification data 522 and the first modification data 521 are generated by the computer 4 in this order as necessary (Step S35 to S37).

Figure 23:
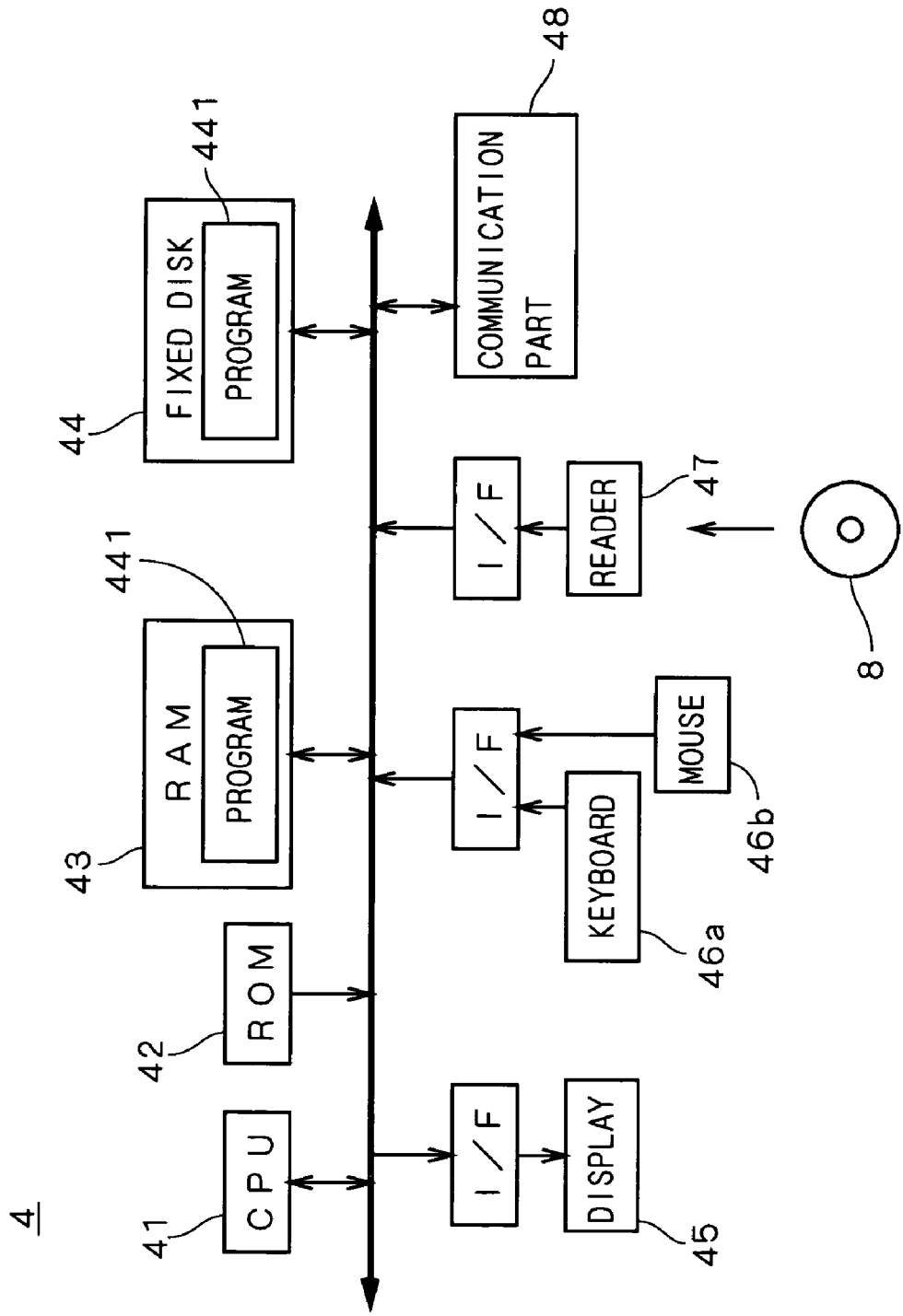
FIG. 23 is a block diagram showing a constitution of a computer.

The computer 4 has a constitution of general computer system, as shown in FIG. 23, where a CPU 41 for performing various computations, a ROM 42 for storing a basic program and a RAM 43 for storing various information are connected to a bus line. To the bus line, a fixed disk 44 for storing information, a display 45 for displaying various information, a keyboard 46a and a mouse 46b for receiving an input from the user, a reader 47 for reading information from a computer-readable recording medium 8 such as an optical disk, a magnetic disk or a magneto-optic disk, and a communication part 48 for making communication with the main body of printing apparatus 1 are further connected through an interface (I/F) as appropriate.

A program 441 is read out from the recording medium 8 through the reader 47 into the computer 4 and stored into the fixed disk 44 in advance. The program 441 is copied to the RAM 43 and the CPU 41 executes computation in accordance with the program 441 stored in the RAM 43 (in other words, the computer 4 executes the program), and the computer 4 thereby performs operations as a modification data generator. The operation of the data modification part 31 can be performed in the computer 4, and in this case, by execution of the program 441, the computer 4 performs operations as a modification apparatus for modifying the width of the original image in the subscan direction to generate the modified image data 53 as discussed above.

Figure 24:
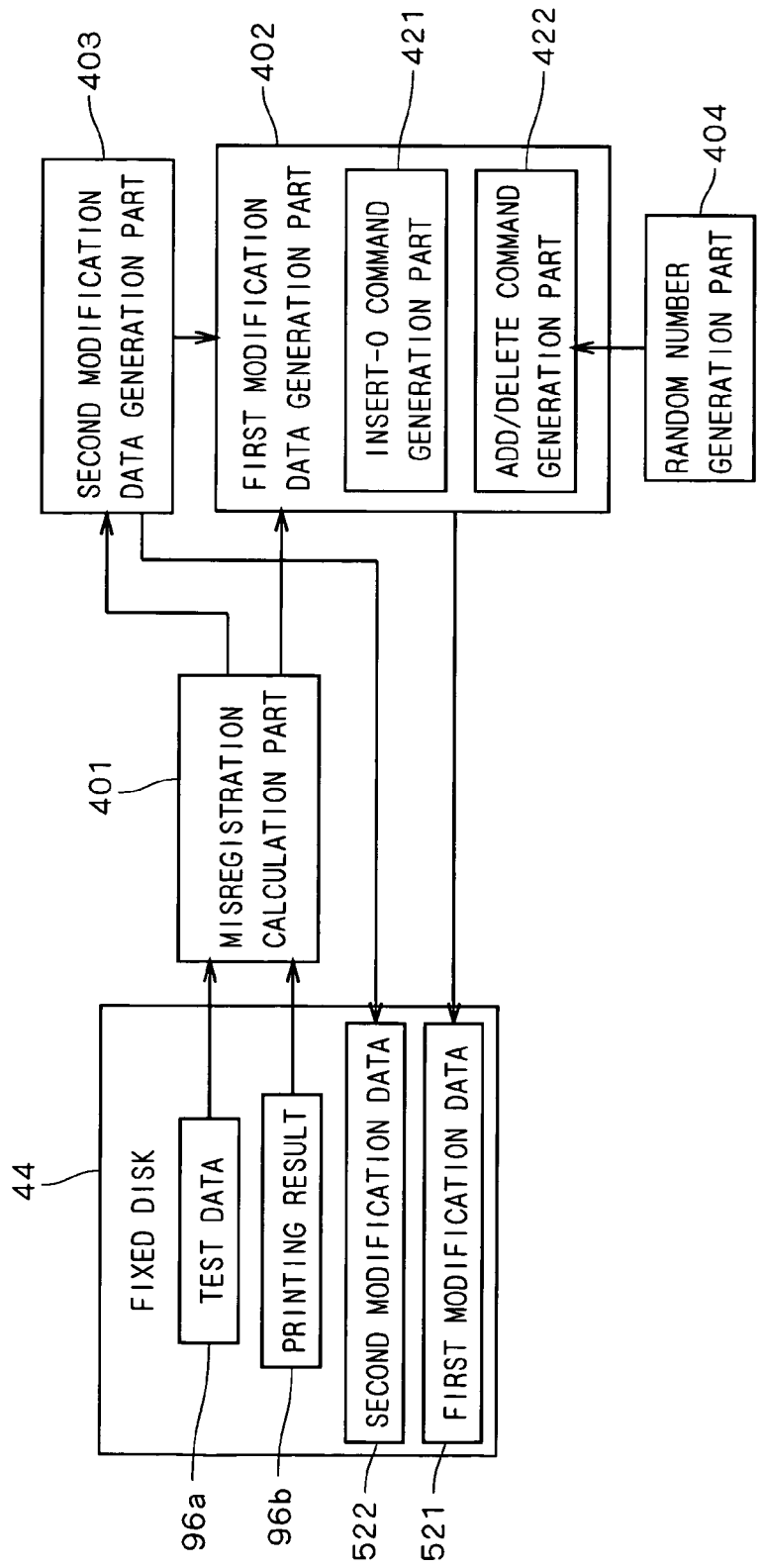

FIG. 24 is a block diagram showing functions implemented by the CPU 41, the ROM 42, the RAM 43, the fixed disk 44 and the like, through operations of the CPU 41 according to the program 441. In FIG. 24, a misregistration calculation part 401, a first modification data generation part 402, a second modification data generation part 403 and a random number generation part 404 represent functions of the CPU 41 and the like.

In the computer 4, test data 96a and a printing result 96b of the test pattern 96 are inputted from the fixed disk 44 to the misregistration calculation part 401, and the amount (i.e., distances in main scan and subscan directions) of misregistration between each reference point in the test pattern 96 and a reference point obtained in the actual printing. In a case of test pattern 96 of FIG. 22A, lattice points serves as reference points and in a case of test pattern 96 of FIG. 22B, register marks around the pattern 97 and positions obtained through linear interpolation of the marks serve as reference points. The user may measure the printing result and input measurement results to the computer 4. In an actual case, the test patterns 96 are printed on all the colors and with one reference point in the test pattern 96 of any one color used as a reference, the amounts of misregistration of all the reference points in the test pattern 96 of each color are obtained. The following discussion will be made on generation of the modification data on one color, but the same processing is performed on other colors.

When the amounts of misregistration are obtained, it is checked if each amount of misregistration is within tolerance (Step S35) and when it is decided that modification is needed, the second modification data 522 is generated by the second modification data generation part 403 in consideration of the spiral exposure, referring to the amounts of misregistration in the main scan direction (Step S36). The second modification data 522 is transmitted to the first modification data generation part 402.

Figure 25:
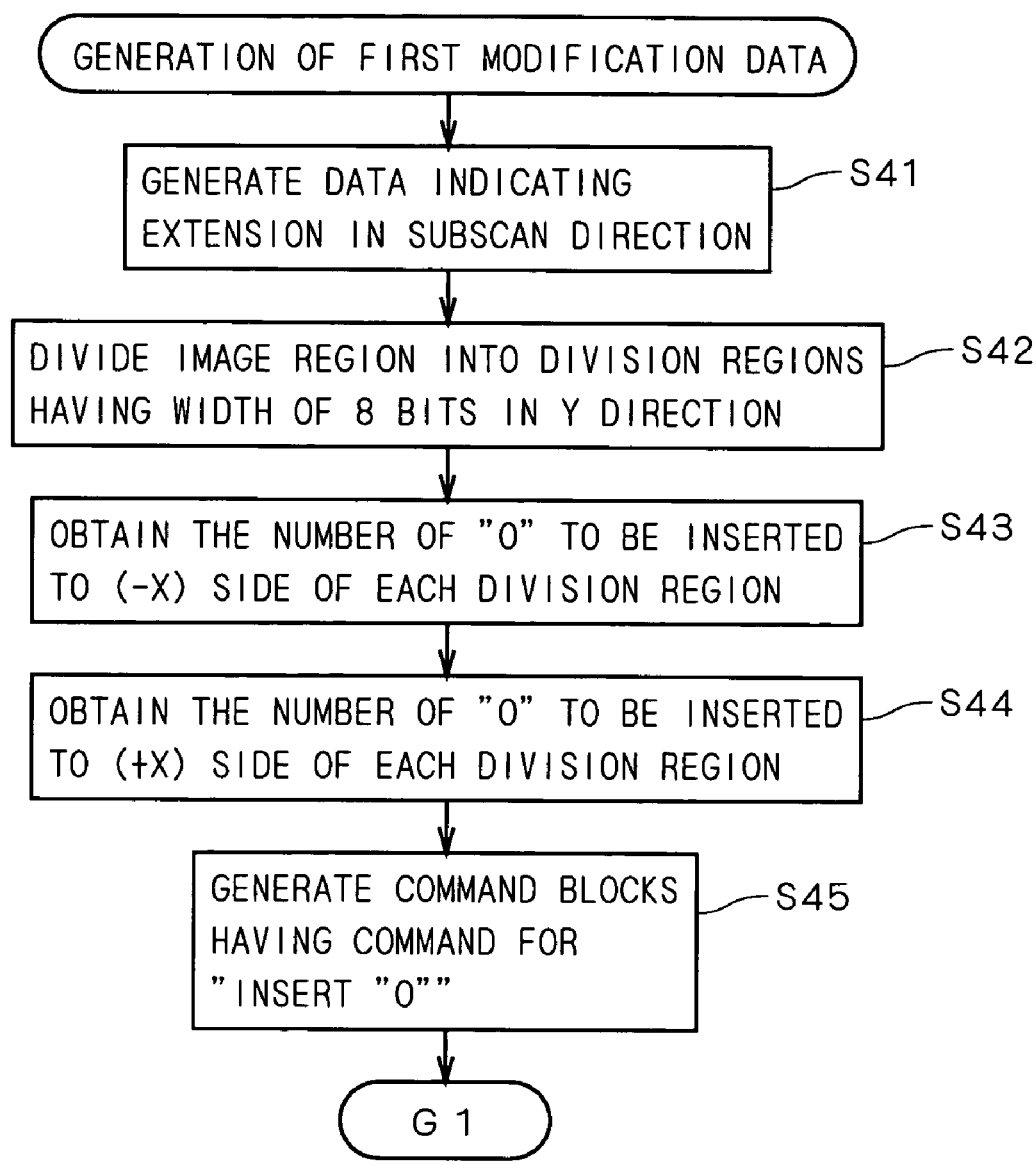
FIGS. 25 and 26 are flowcharts showing an operation of generating first modification data.
Figure 26:
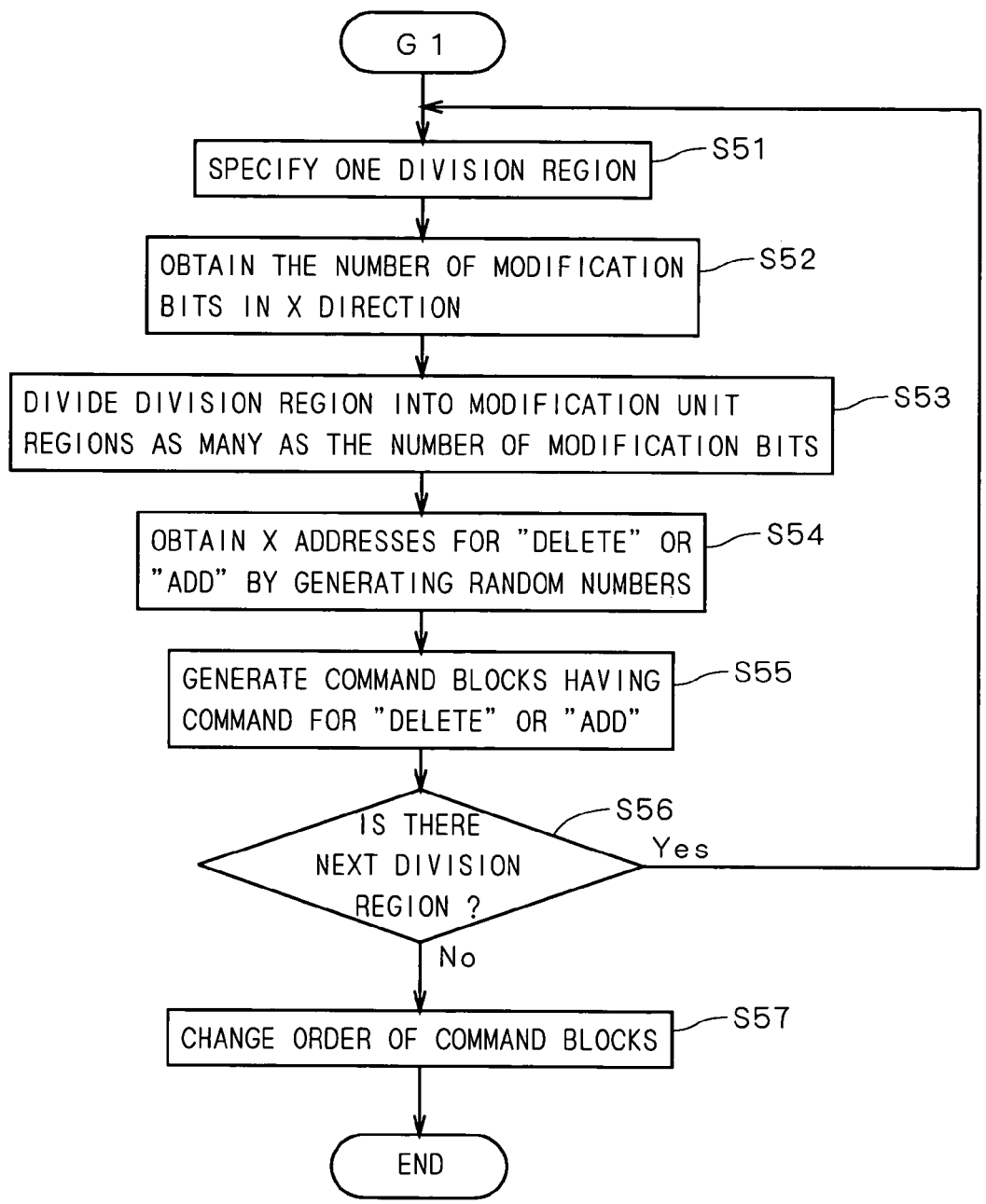
Figure 27:
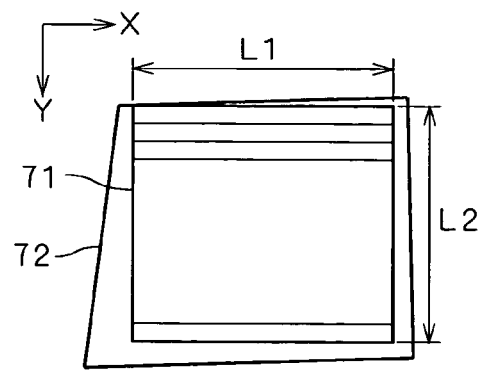
FIG. 27 is a view showing an image region and a printing result.
Figure 28:
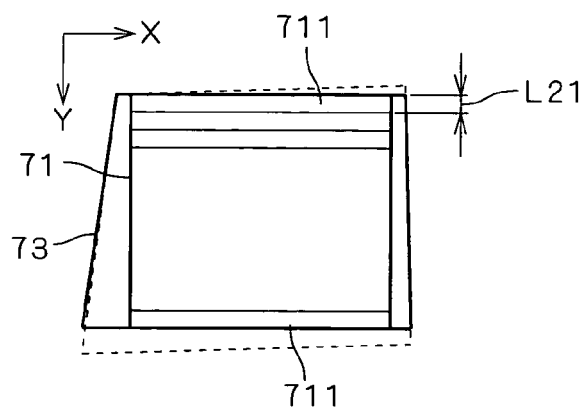
FIG. 28 is a view showing division regions.

FIGS. 25 and 26 are flowcharts showing an operation of generating the first modification data 521. In the first modification data generation part 402, when an ideal image region 71 of FIG. 27 (a region having a specified resolution L1 (the number of pixels) in the subscan direction (X direction) and a specified resolution L2 (the number of pixels) in the main scan direction (Y direction) and corresponds to the modified image space 80) is printed with distortion as indicated by a region 72, for example, the region 72 is contracted in the Y direction, referring to the second modification data 522, to generate a region 73 with upper and lower ends (end portions in the main scan direction) made coincident with those of the region 71 as shown in FIG. 28. In other words, data indicating extension only in the subscan direction, exclusive of the factor of extension in the main scan direction from the amounts of misregistration, is generated (Step S41). In the case of FIG. 27, since the second modification data 522 is data for canceling the extension of image in the main scan direction, an image to be recorded onto the printing plate 91 is one obtained by contracting the image region 71 in the main scan direction on the basis of the second modification data 522.

Next, as shown in FIG. 28, the image region 71 is divided into a plurality of division regions 711 each having width (represented by reference sign L21) of 8 bits (1 Byte) in the Y direction, and the number of "0" in the X direction to be inserted to the (−X) side of the modified image space 80 is obtained on the basis of the length of the region 73 extended off the (−X) side of each division region 711 (see the region 82a of FIG. 10). In other words, since the image region 71 is extended in the subscan direction through printing, "0"s are inserted to the (−X) side of the image region 71 to make the end portion on the (−X) side of an image to be actually printed coincident with the end portion on the (−X) side of the image region 71 (Step S43).

Similarly, the number of "0" in the X direction to be inserted to the (+X) side of the modified image space 80 is obtained on the basis of the length of the region 73 extended out from the (+X) side of each division region 711 (see the region 82b of FIG. 10) (Step S44). A range in the subscan direction where part of the original image should be present in each division region 711 is thereby substantially obtained. At this time, the number of "0" to be inserted is determined in consideration of the spiral modification, and this eliminates necessity of additionally performing the spiral modification when the modified image data 53 is generated in image recording as discussed earlier.

After that, an insert −0 command generation part 421 in the first modification data generation part 402 generates the command blocks 6 for "insert "0"" (each having a run length of 62, a specified X address 63 and a specified Y address 64 for starting insertion of "0" in the modified image space 80 (corresponding to the image region 71) )(see FIG. 9) (Step S45).

Next, in the first modification data generation part 402, one division region 711 is specified (FIG. 26: Step S51), and the number of unit pixel strings 80*a* (hereinafter, referred to as "the number of modification bits") to be deleted from the division region 711 is obtained on the basis of the range in the subscan direction where the original image should be present (Step S52). The number of modification bits is equal to the number of "0" to be inserted to the (±X) sides of one division region 711 when no margin is provided around the modified image space 80. After that, the division region 711 is divided by the number equal to the number of modification bits (Step S53).

Figure 29:
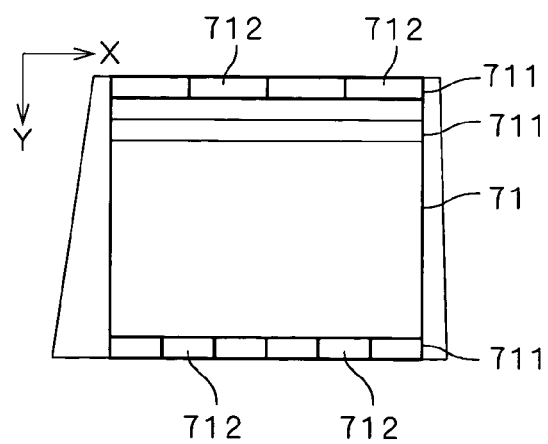
FIG. 29 is a view showing modification unit regions.

FIG. 29 is a view showing division of the division region 711. When the division region 711 at the uppermost stage (on the (−Y) side) is specified in Step S51 and the number of modification bits is 4, for example, the division region 711 is divided into four modification unit regions 712. When the division region 711 at the lowermost stage (on the (+Y) side) is specified in Step S51 and the number of modification bits is 6, the division region 711 is divided into six modification unit regions 712.

Figure 30:
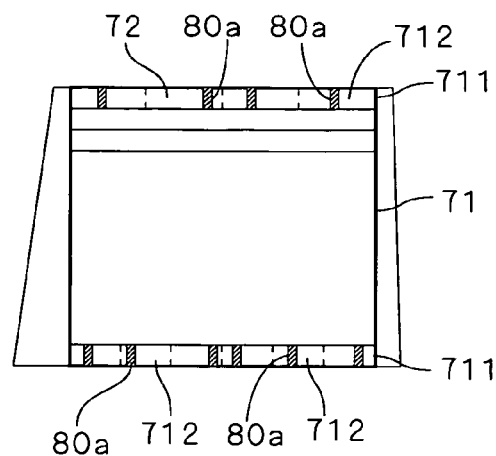
FIGS. 30 and 31 are views showing position of unit pixel strings to be deleted.

Then, the random number generation part 404 generates a random number within the number of pixels (bits) in the width of the X direction of each modification unit region 712, and a position of the unit pixel string 80*a* (i.e., X address) to be deleted from each modification unit region 712 is determined on the basis of the random number (Step S54). When the width of the modification unit region 712 is 100 dots, for example, a random number is generated in a range from −50 to 50 dots. FIG. 30 is a view illustrating a position of the unit pixel string 80*a* in each modification unit region 712 which is determined to be deleted in the division regions 711 at the uppermost and lowermost stages.

In the add/delete command generation part 422 of the first modification data generation part 402, the command blocks 6 for "delete" are generated on the basis of positions of "delete" (in this case, the image region 71 corresponds to a space of the original image and each position of "delete" is represented by the X address and the Y address of the original image) (Step S55). Generation of the command block 6 for "add" will be discussed later.

By performing Steps S52 to S55 while sequentially shifting the division region 711 specified in Step S51 from the (−Y) side to the (+Y) side (Step S56), all the command blocks 6 for "delete" (or "add") are generated.

Finally, by changing the order of the command blocks 6 generated in Steps S45 and S55 in accordance with the above-discussed operation for generating the modified image data 53, generation of the first original image data 521 is completed (Step S57, FIG. 21: Step S37). The generated first modification data 521 is stored in th fixed disk 44 together with the second modification data 522 (Step S38).

Figure 31:
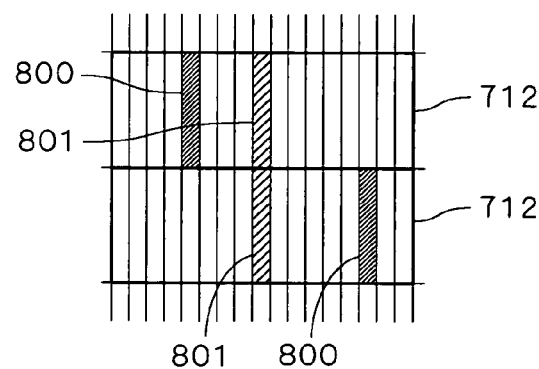

In generation of the first modification data 521, the position of the unit pixel string 80*a* to be deleted in each modification unit region 712 is determined by using the random numbers. As a result, as shown in FIG. 31, X addresses of the unit pixel strings (represented by reference sign 800) in the modification unit regions 712 adjacent to each other in the Y direction are usually different from each other. For example, when the central unit pixel string (represented by reference sign 801) in the modification unit region 712 is deleted, if the adjacent modification unit regions 712 have the same central position, the unit pixel strings 801 to be deleted are aligned in the Y direction and a line in the main scan direction appears in a printed image. In the method of FIG. 26, by using the random numbers, it is possible to prevent an effect of modification from appearing in the modified image as lines.

When generation of the first modification data 521 and the second modification data 522 is completed through the above operations, image recording onto the printing plate 91 and printing are performed again on the basis of these modification data (FIG. 21: Step S39). A printing operation in Step S39 is the same as that shown in FIG. 8. Then, the printing result is automatically acquired by the image pickup part 142 (Step S34), and the amounts of misregistration are obtained and with this, it is checked if remodification is needed (Step S35). If remodification is needed, new first modification data 521 and second modification data 522 are generated on the basis of the amounts of misregistration, reflecting the already-existing first modification data 521 and second modification data 522 (Steps S36 and S37). On the other hand, if remodification is not needed, generation of the modification data is finished.

Though it is assumed in the above discussion that the image region 71 defined by the specified resolutions L1 and L2 is included in the region 72 which is obtained on the basis of the printing result, the specified resolution L1 in the subscan direction may be changed as appropriate. For example, the specified resolution L1 may be made coincident with the upper width of the region 72 as shown in FIG. 32, or the specified resolution L1 may be made coincident with the lower width of the region 72 as shown in FIG. 33.

Figure 32:
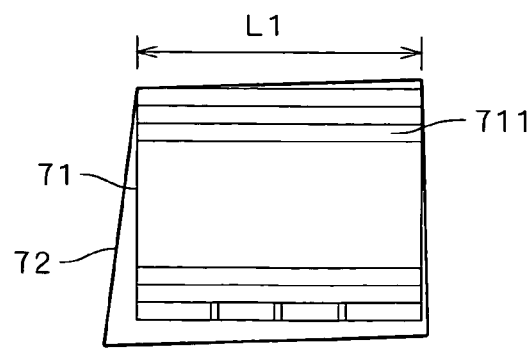
FIGS. 32 and 33 are views showing another examples of specified resolution.
Figure 33:
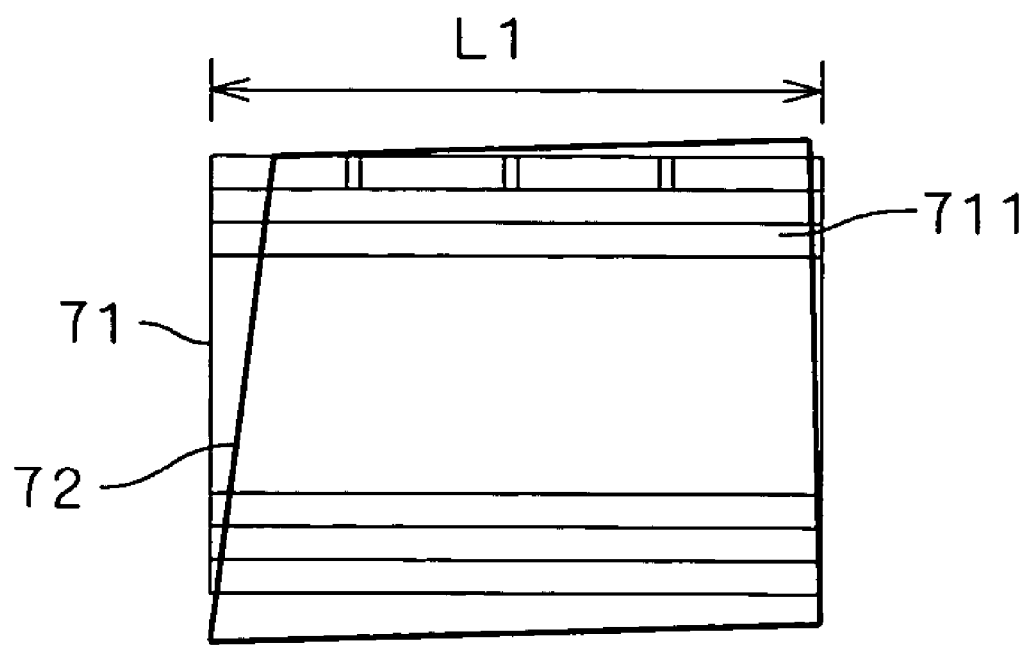

In a case of specified resolution L1 shown in FIG. 32, since the width of each division region 711 in the X direction is larger than that of FIG. 27 but does not exceed the corresponding width of the region 72, only the command blocks 6 for "delete" are generated in Step S55, though the number of command blocks 6 for "delete" is fewer than that in the case of FIG. 27. Conversely, in a case of specified resolution L1 shown in FIG. 33, since the width of each division region 711 in the X direction does not fall below the corresponding width of the region 72, only the command blocks 6 for "add" are generated in Step S55. In FIGS. 32 and 33, since the length relative to the number of pixels in the specified resolution L1 is changed, the feed speed of the writing head 231 and the magnification of zoom lens in the writing head 231 are changed in writing. When the specified resolution L1 lies between the maximum width and the minimum width of the region 72 in the X direction, the command blocks 6 for "delete" and "add" are generated in Step S55.

Generation of the command block 6 for "add" is basically the same as that of the command block 6 for "delete" except that the type of command 61 is different. Specifically, the division region 711 is divided into the modification unit regions 712 as many as the number of modification bits, i.e., the number of unit pixel strings 80*a* to be added, and the position (X address) of each modification unit region 712 to which the unit pixel string 80*a* is inserted is determined on the basis of a random number. As a result, in the modified image data 53 generated on the basis of the first modification data 521, the width on the (−Y) side of the original image in the X direction is extended and the modified image shown in FIG. 10 is generated.

As has been discussed above, in the printing apparatus 1 in accordance with one preferred embodiment of the present invention, in order to modify misregistration in the printing position caused mainly by fan-out, modification in the subscan direction (usually, the modification of trapezoidal component) is performed by computation such as delete or add of the unit pixel strings 80*a* (which may be performed on software as well as by a dedicated electric operation circuit) and the modification in the main scan direction (modification of extension due to fan-out or the like) is performed by controlling the writing clock. This allows reduction of amounts of computation as compared with the case where the modifications in the main scan direction and subscan direction are performed only by computation. Further, it is possible to reduce the number of pixels to be deleted or added and thereby suppress deterioration in image quality. On the other hand, control becomes very easier as compared with the case where the modifications in the main scan direction and subscan direction are performed only by shifting clocks for writing control. As a result, it becomes possible to easily and quickly correct the influence of complicate distortion of paper, and especially, to efficiently prevent misregistration by colors in multicolor printing.

By generating the first modification data 521 as a set of command blocks 6, it is possible to quickly generate the modified image data 53, easily implement the data modification part 31 as hardware and perform on-the-fly recording where writing is started on the basis of some data before all of the modified image data 53 is generated. By using the command block 6, it is possible to reduce the amount of first modification data 521.

By dividing the division region 711 into the modification unit regions 712 and using the random numbers in generation of the first modification data 521, it is possible to diffuse the X addresses at which the unit pixel strings 80a are deleted or added at random and uniformly to some degree. As a result, it is possible to perform modification of an image by extension and contraction in the subscan direction without deterioration in image quality.

Since the modification data is generated on the basis of the printing result of the test pattern 96, it is possible to generate the modification data in accordance with the type of paper and images to be printed with high accuracy.

Though the preferred embodiment of the present invention has been discussed above, the present invention is not limited to the above-discussed preferred embodiment, but allows various variations.

For example, it is not necessary to arrange a plurality of light beams adjacently to one another in the subscan direction, the light beams may be aligned with spaces each equivalent to a plurality of pixels. Only one light beam may be emitted from the writing head 231.

Though the modification using the first modification data 521 is performed by handling a unit pixel string 80a as a unit of modification in the above preferred embodiment, the unit pixel string 80a may be one pixel. Even when the modification is performed by handling a unit pixel string 80a as a unit of modification, with respect to groups of pixels arranged in rows of the subscan direction, the width of the original image in the subscan direction is modified by deleting or adding the pixel in each pixel group.

It is not always necessary to divide the division region 711 at regular intervals. In order to appropriately diffuse the positions of the unit pixel strings 80a to be deleted or added, however, it is preferable that the number of pixels in each of a plurality of modification unit regions 712 in the subscan direction should be half to twice a value obtained by dividing the number of pixels of the division region 711 in the subscan direction by the number of the unit pixel strings 80a to be deleted or added.

The printing apparatus 1 is not limited to a "tandem" apparatus having two plate cylinders 21, but the number of plate cylinders 21 or the number of image regions on the printing plate 91 may be arbitrarily changed.

The method for making a printing plate performed in the printing apparatus 1 may be used in a dedicated plate-making apparatus (e.g., a plate-making apparatus using the CTP technique). In the case where plate making and printing are performed in one apparatus, like in the printing apparatus 1, especially if the holding drum used in plate making is the plate cylinder 21, modification against fan-out is absolutely needed since the user can not make fine adjustments in setting the printing plate to the plate cylinder unlike in a conventional method.

The method of modifying the width of an image in one direction through delete or add of pixels on the basis of the first modification data 521 generated by using random numbers and the method of efficiently modifying the width of an image in one direction through insert of "0", delete or add can be used as a general technique for modifying an image (for example, technique for modifying an image with a computer on software).

While the invention has been shown and described in detail, the foregoing description is in all aspects illustrative and not restrictive. It is therefore understood that numerous modifications and variations can be devised without departing from the scope of the invention.

What is claimed is:

1. An image recording apparatus for recording an image by irradiating a printing plate with a light beam, comprising:
a holding drum for holding a printing plate;
a light emission part for irradiating said printing plate with a light beam to perform writing;
a rotation mechanism for scanning an irradiation position of said light beam on said printing plate in a main scan direction by rotating said holding drum relatively to said light emission part;
a moving mechanism for scanning said irradiation position in a subscan direction by moving said light emission part relatively to said holding drum along a direction parallel to a rotation axis of said holding drum;
a storage part for storing data of an original image;
an operation part for generating data of a modified image obtained by substantially modifying width of said original image in said subscan direction in consideration of extension of a paper caused by dampening water in printing with said printing plate, said modified image indicating said original image distorted in said subscan direction without being distorted in said main scan direction; and
a control part for controlling emission of said light beam according to said data of said modified image while shifting writing timing in said main scan direction by changing a cycle of a writing clock.

2. The image recording apparatus according to claim 1, wherein
said operation part modifies said width of said original image in said subscan direction by deleting or adding pixels.

3. The image recording apparatus according to claim 2, wherein
said operation part divides a pixel group constituted of pixels aligned in said subscan direction into a plurality of modification unit pixel groups as many as pixels to be deleted or added and determines a position of one pixel to be deleted or added from/to each of said plurality of modification unit pixel groups on the basis of a random number.

4. The image recording apparatus according to claim 3, wherein
the number of pixels in each of said plurality of modification unit pixel groups is half to twice a value obtained by dividing the number of pixels in said pixel group by the number of said pixels to be deleted or added.

5. The image recording apparatus according to claim 2, wherein
said storage part stores processing instruction data indicating positions of pixels to be deleted or added in said original image and substantially indicating distortion of said original image in said modified image, and
said operation part generates data of said modified image on the basis of said processing instruction data.

6. The image recording apparatus according to claim 5, wherein said processing instruction data comprises:
commands for inserting a blank to one end of said subscan direction in an image space where said modified image is generated; and
commands for deleting or adding pixels in aligning pixels of said original image from said one end to the other end following said blank.

7. The image recording apparatus according to claim 6, wherein
said light emission part emits a plurality of light beams aligned in said subscan direction, and
data of said modified image generated with said commands for inserting a blank is data for performing writing while continuously moving irradiation positions of said plurality of light beams in said subscan direction.

8. The image recording apparatus according to claim 1, wherein
recording of an image onto said printing plate is started on the basis of some data before said operation part generates the whole data of said modified image.

9. The image recording apparatus according to claim 1, wherein
said operation part obtains data of said modified image and data of shifting of writing timing in said main scan direction by said control part, on the basis of a printing result of a test pattern.

10. The image recording apparatus according to claim 9, further comprising
an image pickup part for performing an image pickup of a paper on which said test pattern is printed, to acquire said printing result.

11. The image recording apparatus according to claim 1, wherein said control part performs writing in consideration of extension of said paper in said main scan direction in said printing.

12. A printing apparatus, comprising:
a holding drum for holding a printing plate;
a light emission part for irradiating said printing plate with a light beam to perform writing;
a rotation mechanism for scanning an irradiation position of said light beam on said printing plate in a main scan direction by rotating said holding drum relatively to said light emission part;
a moving mechanism for scanning said irradiation position in a subscan direction by moving said light emission part relatively to said holding drum along a direction parallel to a rotation axis of said holding drum;
a storage part for storing data of an original image;
an operation part for generating data of a modified image obtained by substantially modifying width of said original image in said subscan direction in consideration of extension of a paper caused by dampening water in printing with said printing plate, said modified image indicating said original image distorted in said subscan direction without being distorted in said main scan direction;
a control part for controlling emission of said light beam according to said data of said modified image while shifting writing timing in said main scan direction by changing a cycle of a writing clock; and
a printing mechanism for performing printing with said printing plate on which an image is recorded by said light emission part.

13. The printing apparatus according to claim 12, wherein printing is performed by using said printing plate held by said holding drum.

14. The printing apparatus according to claim 12, wherein said printing mechanism performs multicolor printing.

15. The printing apparatus according to claim 12, wherein said operation part modifies said width of said original image in said subscan direction by deleting or adding pixels.

16. The printing apparatus according to claim 12, wherein recording of an image onto said printing plate is started on the basis of some data before said operation part generates the whole data of said modified image.

17. The printing apparatus according to claim 12, wherein said operation part obtains data of said modified image and data of shifting of writing timing in said main scan direction by said control part, on the basis of a printing result of a test pattern.

18. The printing apparatus according to claim 17, further comprising
an image pickup part for performing an image pickup of a paper on which said test pattern is printed, to acquire said printing result.

19. The image printing apparatus according to claim 12, wherein said control part performs writing in consideration of extension of said paper in said main scan direction in said printing.

20. An image recording method of recording an image onto a printing plate, comprising the steps of:
a) preparing data of an original image;
b) generating data of a modified image obtained by substantially modifying width of said original image in a predetermined subscan direction in consideration of extension of a paper caused by dampening water in printing with a printing plate, said modified image indicating said original image distorted in said subscan direction without being distorted in a main scan direction orthogonal to said subscan direction; and
c) performing image recording by irradiating said printing plate held by a holding drum with a light beam,
wherein an irradiation position of said light beam on said printing plate is scanned in said main scan direction by rotating said holding drum relatively to a light emission part, said irradiation position is scanned in said subscan direction by moving said light emission part relatively to said holding drum along a direction parallel to a rotation axis of said holding drum, and said light beam is emitted from said light emission part on the basis of data of said modified image in synchronization with scanning in said main scan direction and said subscan direction while shifting writing timing for said light beam in said main scan direction by changing a cycle of a writing clock in said step c).

21. The image recording method according to claim 20, wherein
said width of said original image in said subscan direction is modified by deleting or adding pixels in said step b).

22. The image recording method according to claim 21, wherein
a pixel group constituted of pixels aligned in said subscan direction is divided into a plurality of modification unit pixel groups as many as pixels to be deleted or added and a position of one pixel to be deleted or added from/to each of said plurality of modification unit pixel groups is determined on the basis of a random number in said step b).

23. The image recording method according to claim 22, wherein
the number of pixels in each of said plurality of modification unit pixel groups is half to twice a value obtained by dividing the number of pixels in said pixel group by the number of said pixels to be deleted or added.

24. The image recording method according to claim 21, wherein
data of said modified image is generated on the basis of processing instruction data indicating positions of pixels to be deleted or added in said original image and substantially indicating distortion of said original image in said modified image in said step b).

25. The image recording method according to claim 24, wherein said processing instruction data comprises:
commands for inserting a blank to one end of said subscan direction in an image space where said modified image is generated; and
commands for deleting or adding pixels in aligning pixels of said original image from said one end to the other end following said blank.

26. The image recording method according to claim 25, wherein
a plurality of light beams aligned in said subscan direction are emitted to said printing plate in said step c), and
data of said modified image generated with said commands for inserting a blank is data for performing writing while continuously moving irradiation positions of said plurality of light beams in said subscan direction.

27. The image recording method according to claim 20, wherein
recording of an image onto said printing plate is started on the basis of some data before said operation part generates the whole data of said modified image.

28. The image recording method according to claim 20, wherein
data of said modified image and data of shifting of writing timing in said main scan direction are obtained on the basis of a printing result of a test pattern.

29. The image recording method according to claim 28, further comprising the step:
acquiring said printing result by performing an image pickup of a paper on which said test pattern is printed.

30. The image recording method according to claim 20, wherein writing is performed in consideration of extension of said paper in said main scan direction in said printing in said step c).

31. An image modification method of modifying width of an image in a predetermined direction, comprising the steps of:
dividing a pixel group constituted of pixels aligned in a predetermined direction into a plurality of modification unit pixel groups as many as pixels to be deleted or added, said pixel group being not divided at regular intervals;
determining a position of one pixel to be deleted or added from/to each of said plurality of modification unit pixel groups on the basis of a random number; and
modifying said pixel group by deleting or adding said one pixel from/to a position determined in each of said plurality of modification unit pixel groups,
wherein the number of pixels in each of said plurality of modification unit pixel groups is half to twice a value obtained by dividing the number of pixels in said pixel group by the number of pixels to be added or deleted.

32. An image recording apparatus for recording an image by irradiating a printing plate with a light beam, comprising:
a holding drum for holding a printing plate;
a light emission part for irradiating said printing plate with a light beam to perform writing;
a rotation mechanism for scanning an irradiation position of said light beam on said printing plate in a main scan direction by rotating said holding drum relatively to said light emission part;
a moving mechanism for scanning said irradiation position in a subscan direction by moving said light emission part relatively to said holding drum along a direction parallel to a rotation axis of said holding drum;
a storage part for storing data of an original image;
an operation part for generating data of a modified image obtained by substantially modifying width of said original image in said subscan direction, said modified image indicating said original image distorted in said subscan direction without being distorted in said main scan direction; and
a control part for controlling emission of said light beam according to said data of said modified image while shifting writing timing in said main scan direction by changing a cycle of a writing clock wherein
said operation part modifies said width of said original image in said subscan direction by deleting or adding pixels where said operation part divides a pixel group constituted of pixels aligned in said subscan direction into a plurality of modification unit pixel groups as many as pixels to be deleted or added and determines a position of one pixel to be deleted or added from/to each of said plurality of modification unit pixel groups on the basis of a random number, and
the number of pixels in each of said plurality of modification unit pixel groups is half to twice a value obtained by dividing the number of pixels in said pixel group by the number of said pixels to be deleted or added.

33. A printing apparatus comprising:
a holding drum for holding a printing plate;
a light emission part for irradiating said printing plate with a light beam to perform writing;
a rotation mechanism for scanning an irradiation position of said light beam on said printing plate in a main scan direction by rotating said holding drum relatively to said light emission part;
a moving mechanism for scanning said irradiation position in a subscan direction by moving said light emission part relatively to said holding drum along a direction parallel to a rotation axis of said holding drum;
a storage part for storing data of an original image;
an operation part for generating data of a modified image obtained by substantially modifying width of said original image in said subscan direction, said modified image indicating said original image distorted in said subscan direction without being distorted in said main scan direction; and a control part for controlling emission of said light beam according to said data of said modified image while shifting writing timing in said main scan direction by changing a cycle of a writing clock; and a printing mechanism for performing printing with said printing plate on which an image is recorded by said light emission part, wherein said operation part modifies said width of said original image in said subscan direction by deleting or adding pixels where said operation part divides a pixel group constituted of pixels aligned in said subscan direction into a plurality of modification unit pixel groups as many as pixels to be deleted or added and determines a position of one pixel to be deleted or added from/to each of said plurality of modification unit pixel groups on the basis of a random number, and the number of pixels in each of said plurality of modification unit pixel groups is half to twice a value obtained by dividing the number of pixels in said pixel group by the number of said pixels to be deleted or added.

34. An image recording method of recording an image onto a printing plate, comprising the steps of:

a) preparing data of an original image;

b) generating data of a modified image obtained by substantially modifying width of said original image in a predetermined subscan direction, said modified image indicating said original image distorted in said subscan direction without being distorted in a main scan direction orthogonal to said subscan direction; and c) performing image recording by irradiating a printing plate held by a holding drum with a light beam, wherein an irradiation position of said light beam on said printing plate is scanned in said main scan direction by rotating said holding drum relatively to a light emission part, said irradiation position is scanned in said subscan direction by moving said light emission part relatively to said holding drum along a direction parallel to a rotation axis of said holding drum, and said light beam is emitted from said light emission part on the basis of data of said modified image in synchronization with scanning in said main scan direction and said subscan direction while shifting writing timing for said light beam in said main scan direction by changing a cycle of a writing clock in said step c), said width of said original image in said subscan direction is modified by deleting or adding pixels in said step b) where a pixel group constituted of pixels aligned in said subscan direction is divided into a plurality of modification unit pixel groups as many as pixels to be deleted or added and a position of one pixel to be deleted or added from/to each of said plurality of modification unit pixel groups is determined on the basis of a random number, and the number of pixels in each of said plurality of modification unit pixel groups is half to twice a value obtained by dividing the number of pixels in said pixel group by the number of said pixels to be deleted or added.

* * * * *